US012796557B2

(12) United States Patent
Chuang et al.

(10) Patent No.: US 12,796,557 B2
(45) Date of Patent: Nov. 10, 2026

(54) PACKAGE STRUCTURE

(71) Applicant: Advanced Semiconductor Engineering, Inc., Kaohsiung (TW)

(72) Inventors: Hung Yi Chuang, Kaohsiung (TW); Wu Chou Hsu, Kaohsiung (TW); Cheng-Yuan Kung, Kaohsiung (TW); Shin-Luh Tarng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 372 days.

(21) Appl. No.: 18/406,044

(22) Filed: Jan. 5, 2024

(65) Prior Publication Data

US 2025/0226364 A1 Jul. 10, 2025

(51) Int. Cl.

| | |
|---|---|
| ***H01L 25/16*** | (2023.01) |
| ***H01L 23/00*** | (2006.01) |
| ***H10W 44/00*** | (2026.01) |
| ***H10W 70/68*** | (2026.01) |
| ***H10W 70/685*** | (2026.01) |
| ***H10W 90/00*** | (2026.01) |
| *H10W 74/00* | (2026.01) |

(52) U.S. Cl.

CPC ......... *H10W 90/00* (2026.01); *H10W 44/601* (2026.01); *H10W 70/68* (2026.01); *H10W 70/685* (2026.01); *H10W 74/00* (2026.01); *H10W 90/794* (2026.01)

(58) Field of Classification Search

CPC . H10W 90/00; H10W 90/794; H10W 90/756; H10W 90/724; H10W 90/728; H10W 44/601; H10W 44/00; H10W 44/60; H10W 44/401; H10W 44/20; H10W 70/68; H10W 70/685; H10W 70/688; H10W 70/65; H10W 74/00; H10W 74/15; H10W 90/736; H10W 74/207; H10W 74/129

See application file for complete search history.

(56) References Cited

U.S. PATENT DOCUMENTS

| | | | | |
|---|---|---|---|---|
| 7,138,815 | B1 * | 11/2006 | Alexander | G01R 31/2853 324/762.02 |
| 10,903,169 | B2 | 1/2021 | Huang | |
| 11,424,539 | B2 * | 8/2022 | Alpman | H01Q 9/0414 |
| 2020/0091608 | A1 * | 3/2020 | Alpman | H01Q 9/0414 |

* cited by examiner

*Primary Examiner* — Nikolay K Yushin
(74) *Attorney, Agent, or Firm* — Foley & Lardner LLP

(57) ABSTRACT

A package structure is provided. The package structure includes a substrate and a power module. The substrate defines a cavity. The power module includes a power regulation portion and a noise filter portion, wherein the power regulation portion and the noise filter portion are disposed in the cavity of the substrate.

19 Claims, 23 Drawing Sheets

2C

PACKAGE STRUCTURE

BACKGROUND

1. Technical Field

The present disclosure relates generally to a package structure.

2. Description of the Related Art

Currently, capacitors may be integrated in a package structure by disposing the capacitors in a cavity of the substrate followed by filling the cavity with a molding material to encapsulate the capacitors. However, the molding material may not fully fill the cavity, and thus voids may be formed. On the other hand, when a molding material having a relatively high flowability is used, the as-formed molding layer may have insufficient rigidity and thus warpage of the package structure may occur.

SUMMARY

In one or more arrangements, a package structure includes a substrate and a power module. The substrate defines a cavity. The power module includes a power regulation portion and a noise filter portion, wherein the power regulation portion and the noise filter portion are disposed in the cavity of the substrate.

In one or more arrangements, a package structure includes a substrate, an electronic component, and a power module. The electronic component is over the substrate. The power module includes a power regulation portion and a noise filter portion embedded in the substrate. The package structure defines a power path configured to provide a power signal to the electronic component. The power path includes a first path portion extending from the power regulation portion to the noise filter portion and a second path portion extending from the noise filter portion to the electronic component, and a path length of the first path portion is greater than a path length of the second path portion.

In one or more arrangements, a package structure includes a substrate, a power regulation module, and a noise filter module. The power regulation module is embedded in the substrate. The noise filter module is embedded in the substrate and includes a first capacitor and a second capacitor, wherein the second capacitor is configured to operate at a frequency higher than that of the first capacitor, and the second capacitor is closer to an edge of the substrate than the first capacitor is.

BRIEF DESCRIPTION OF THE DRAWINGS

Aspects of the present disclosure are better understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
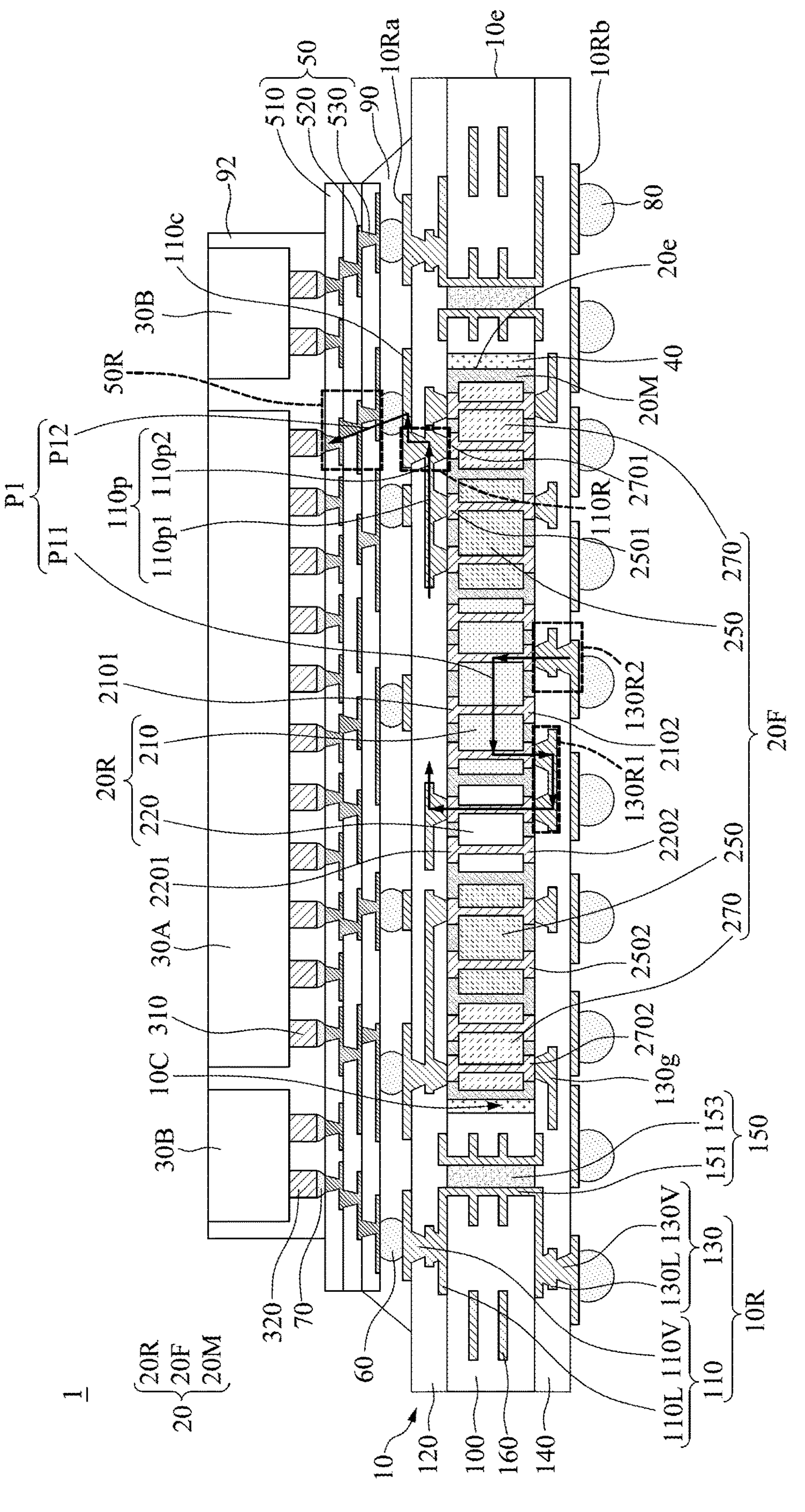
FIG. 1A is a cross-section of a package structure in accordance with some arrangements of the present disclosure.
Figure 1B:
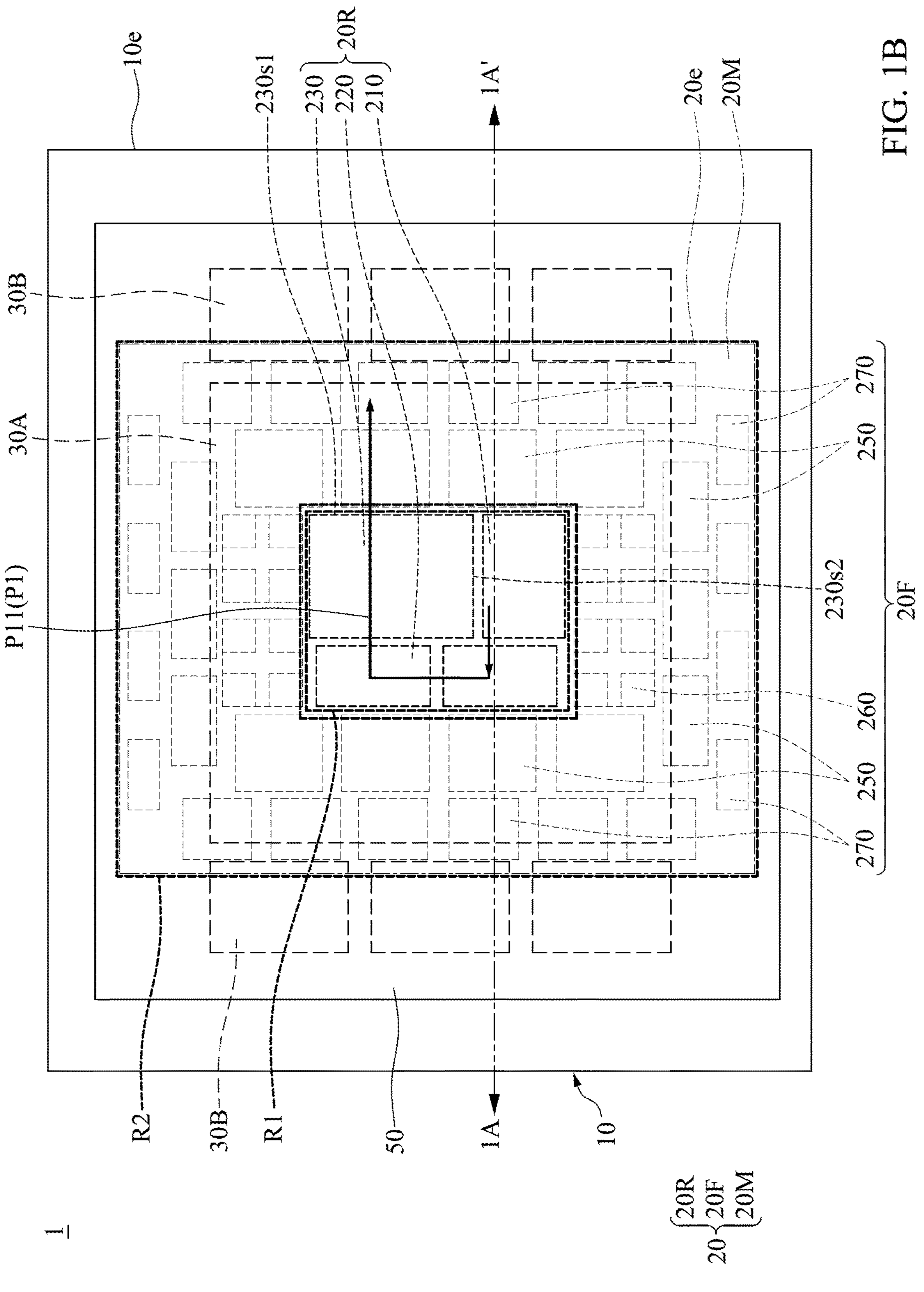
FIG. 1B is a top view of a package structure in accordance with some arrangements of the present disclosure.

FIG. 1A is a cross-section of a package structure 1 in accordance with some arrangements of the present disclosure. FIG. 1B is a top view of a package structure 1 in accordance with some arrangements of the present disclosure. In some arrangements, FIG. 1A is a cross-section along the line 1A-1A' in FIG. 1B. The package structure 1 may include a substrate 10, a power module 20, electronic components 30A and 30B, a protective layer 40, a redistribution layer (RDL) 50, connection elements 60 and 70, electrical contacts 80, an underfill 90, and an encapsulant 92.

The substrate 10 may include, for example, a printed circuit board, such as a paper-based copper foil laminate, a composite copper foil laminate, or a polymer-impregnated glass-fiber-based copper foil laminate. The substrate 10 may include an inorganic-based material, such as glass. The substrate 10 may include an interconnection structure, which may include a plurality of conductive traces and/or conductive vias. The interconnection structure may include a redistribution layer (RDL) and/or a grounding element. In some arrangements, the substrate 10 may include an organic substrate or a leadframe. In some arrangements, the substrate 10 may include a ceramic material or a metal plate. The substrate 10 may include a semiconductor wafer or an electronic component. The electronic component may be a chip or a die including a semiconductor substrate, one or more integrated circuit devices, and one or more overlying interconnection structures therein. The integrated circuit devices may include active devices such as transistors and/or passive devices such resistors, capacitors, inductors, or a combination thereof. In some arrangements, the substrate 10 may include one or more conductive elements, surfaces, contacts, or pads. In some arrangements, the substrate 10 may include a two-layer substrate which includes a core layer and a conductive material and/or structure disposed on an upper surface and a bottom surface of the substrate.

In some arrangements, the substrate 10 includes a core layer 100, a circuit structure 10R, and dielectric layers 120 and 140. The core layer 100 may include a plurality of dielectric layers (not shown in drawings) laminated to each other. In some arrangements, the substrate 10 (or the core layer 100) defines a cavity 10C. The cavity 10C may be a through hole penetrating the core layer 100. The circuit structure 10R may have a top surface 10Ra and a bottom surface 10Rb. In some arrangements, the circuit structure 10R may be referred to as a low-density wiring structure. In some arrangements, the circuit structure 10R includes an upper structure 110 (also referred to as "a sub-structure"), a lower structure 130 (also referred to as "a sub-structure"), conductive vias 150 penetrating the core layer 100 and electrically connecting the upper structure 110 and the lower structure 130 (or the sub-structures), and conductive layers 160 in the core layer 100. In some arrangements, the upper structure 110 and the lower structure 130 are in the dielectric layers 120 and 140, respectively. In some arrangements, the upper structure 110 includes one or more circuit layers 110L and one or more conductive vias 110V connecting the circuit layers 110L. Each of the circuit layers 110L may include conductive layers, conductive pads, conductive patterns, conductive portions, or a combination thereof. In some arrangements, the lower structure 130 includes one or more circuit layers 130L and one or more conductive vias 130V connecting the circuit layers 130L. Each of the circuit layers 130L may include conductive layers, conductive pads, conductive patterns, conductive portions, or a combination thereof. In some arrangements, each of the conductive vias 150 includes a conductive liner 151 on a sidewall of a through hole of the core layer 100 and an insulating material 153 filled in the through hole and surrounded by the conductive liner 151. In some arrangements, the conductive layers 160 are formed or disposed between the dielectric layers of the core layer 100 and may electrically connect to the conductive vias 150.

In some arrangements, the circuit structure 10R includes various portions configured to electrically connect to various elements and/or configured to perform various electrical functions, which will be discussed hereinafter in details. In some arrangements, the circuit structure 10R includes a power line 110*p* (i.e., one of the circuit layers 110L) configured to transmit a power signal. The power line 110*p* may be referred to as a power plane. In some arrangements, the power line 110*p* (or the circuit layer) may include a plurality portions (e.g., portions 110*p*1 and 110*p*2) electrically connected to each other and respectively electrically connected to various different electronic elements to connect the electronic elements in parallel. In some arrangements, the circuit structure 10R further includes a ground line 130*g* (i.e., one of the circuit layers 130L) configured to electrically connect one or more elements/components to ground. The ground line 130*g* may be referred to as a ground plane. In some arrangements, the circuit structure 10R includes at least portions 110R, 130R1, and 130R2 each configured to provide respective electrical connection functions. The portion 110R may be referred to as a connection element. In some arrangements, the portion 110R includes a portion of the circuit layer 110L (or a portion of the power line 110*p*) and one or more of the conductive vias 110V. In some arrangements, the portion 130R1 includes a portion of the circuit layer 130L and one or more of the conductive vias 130V. In some arrangements, the portion 130R2 includes a portion of the circuit layer 130L and one or more of the conductive vias 130V. In some arrangements, the portion 130R1 is electrically disconnected to the portion 130R2. In some arrangements, the portions 130R1 and 130R2 are electrically disconnected to the ground line 130*g*.

The power module 20 may be embedded in the substrate 10. The power module 20 may be referred to as an embedded integrated hybrid component (E-IHC). In some arrangements, the power module 20 includes a regulation portion 20R, a filter portion 20F, and an encapsulant 20M encapsulating the regulation portion 20R and the filter portion 20F. In some arrangements, the regulation portion 20R and the filter portion 20F are embedded in the substrate 10. The power module 20 may be referred to as a molded power module. In some arrangements, the regulation portion 20R is electrically coupled to the filter portion 20F through the circuit structure 10R. In some arrangements, the regulation portion 20R is spaced apart from the filter portion 20F by a portion of the encapsulant 20M. In some arrangements, the regulation portion 20R and the filter portion 20F each includes a plurality of conductive pads (e.g., conductive pads 2101, 2102, 2201, 2202, 2501, 2502, 2701, and 2702) encapsulated by the encapsulant 20M, and top surfaces of the conductive pads are exposed by the encapsulant 20M and electrically connected to the circuit structure 10R. The regulation portion 20R may be referred to as a power regulation portion or a power regulation module. In some arrangements, the regulation portion 20R is or includes a voltage regulation module (VRM). The filter portion 20F may be referred to as a noise filter portion or a noise filter module.

In some arrangements, the power module 20 is disposed in the cavity 10C of the substrate 10. In some arrangements, the regulation portion 20R and the filter portion 20F are both disposed in the same cavity 10C of the substrate 10. In some arrangements, the power module 20 is configured to transmit a power signal to the electronic component 30A. In some arrangements, the power line 110*p* (or the circuit layer) is between the power module 20 and the electronic component 30A and configured to transmit a regulated power signal from the regulation portion 20R toward the electronic component 30A. In some arrangements, the power line 110*p* is configured to transmit a regulated power signal from the regulation portion 20R, passing a point connected to the filter portion 20F without bypassing the filter portion 20F, and toward the electronic component 30A. In some arrangements, the ground line 130*g* (or the circuit layer) is configured to electrically connect the power module 20 to ground. In some arrangements, the power line 110*p* and the ground line 130*g* are at opposite sides of the power module 20.

In some arrangements, the power module 20 is configured to transmit a power signal to the electronic component 30A through a connection element (e.g., the portion 110R) of the circuit structure 10R. In some arrangements, the filter portion 20F is closer to the connection element (or the portion 110R) than the regulation portion 20R is. In some arrangements, the filter portion 20F is closer to the electronic component 30A than the regulation portion 20R is. In some arrangements, the filter portion 20F is closer to an edge 10*e* of the package structure 1 (or an edge of the substrate 10) than the regulation portion 20R is. In some arrangements, the filter portion 20F is closer to an edge 20*e* of the power module 20 than the regulation portion 20R is. In some arrangements, referring to FIG. 1B, the filter portion 20F surrounds the regulation portion 20R. In some arrangements, referring to FIG. 1B, a region R1 defines a coverage of the regulation portion 20R, and a region R2 defines a coverage of the filter portion 20F. In some arrangements, the region R2 surrounds the region R1.

In some arrangements, the power module 20 includes an active element (e.g., a regulator element 210), an inductor 220, and at least one capacitor (e.g., capacitors 230, 250, 260, and 270). In some arrangements, the encapsulant 20M encapsulates the active element (or the regulator element 210), the inductor 220, and the at least one capacitor (e.g., the capacitors 230, 250, 260, and 270). In some arrangements, top surfaces of the regulator element 210, the inductor 220, and the at least one capacitor (e.g., the capacitors 230, 250, 260, and 270) are received within the cavity 10C of the substrate 10. In some arrangements, the regulator element 210, the inductor 220, and the at least one capacitor (e.g., the capacitors 230, 250, 260, and 270) are between an elevation of the top surface 10Ra of the circuit structure 10R and an elevation of the bottom surface 10Rb of the circuit structure 10R.

In some arrangements, the power module 20 includes the regulator element 210, the inductor 220, and the capacitors 230, 250, 260, and 270. In some arrangements, the power line 110*p* electrically couples to the power module 20, and the ground line 130*g* is configured to electrically connect the capacitors 230, 250, 260, and 270 to ground. In some arrangements, as shown in FIG. 1A, the conductive pads 2502 and 2702 are connected to the ground line 130*g*. In some arrangements, the regulation portion 20R includes the regulator element 210, the inductor 220, and the capacitor 230. In some arrangements, the filter portion 20F includes the capacitors 250, 260, and 270. In some arrangements, the capacitor 230 of the regulation portion 20R and the capacitors 250, 260, and 270 of the filter portion 20F have different capacitance values. In some arrangements, the capacitance value of the capacitor 230 of the regulation portion 20R is greater than the capacitance values of the capacitors 250, 260, and 270. In some arrangements, the capacitance value of the capacitor 230 may range from about 1 μF to less than about 100 μF. In some arrangements, the capacitance values of the capacitors 250, 260, and 270 may be about 100 nF. In some arrangements, the regulation portion 20R and the filter portion 20F are configured to operate at different frequencies. In some arrangements, the filter portion 20F is configured to operate at a frequency or a frequency range higher than that of the regulation portion 20R. In some arrangements, the capacitor 230 of the regulation portion 20R and the capacitors 250, 260, and 270 of the filter portion 20F are configured to operate at different frequencies. In some arrangements, the capacitor 230 of the regulation portion 20R is configured to operate at a frequency lower than that of the capacitors 250, 260, and 270 of the filter portion 20F.

In some arrangements, the regulation portion 20R is or includes a voltage regulation module (VRM). In some arrangements, the portion 130R2 of the circuit structure 10R is configured to receive a power signal (also referred to as "a first power signal") supplied from a power source to the active element (or the regulator element 210). In some arrangements, the active element (or the regulator element 210) is configured to regulate the power signal (or the first power signal). In some arrangements, the regulator element 210 is or includes a power management integrated circuit (PMIC). In some arrangements, the portion 130R1 of the circuit structure 10R electrically connects the inductor 220 to the active element (or the regulator element 210). In some arrangements, the capacitor 230 is electrically coupled to the active element (or the regulator element 210). In some arrangements, the capacitor 230 is configured to decouple noise of a frequency range from about 1 KHz to less than less than about 1 MHz. The capacitor 230 may be or include a polymer-based capacitor. In some arrangements, the regulator element 210 and the inductor 220 are connected in-series. In some arrangements, the regulator element 210 and the inductor 220 are connected to the capacitor 230 in parallel.

In some arrangements, the regulation portion 20R is configured to regulate the received power signal (or the first power signal) into a regulated power signal (also referred to as "a second power signal") different from the received power signal (or the first power signal). In some arrangements, the received power signal (or the first power signal) includes a first voltage, and the regulated power signal (or the second power signal) includes a second voltage different from the first voltage. In some arrangements, the regulation portion 20R is configured to provide a regulated power signal at and above a predetermined frequency (also referred to as "a first frequency"). The first frequency may be KHz.

In some arrangements, the filter portion 20F is or includes a filter module or a bypass module. In some arrangements, the capacitors 250, 260, and 270 may be or include decoupling capacitors configured to decouple noise from the power signal. In some arrangements, the capacitors 250 and 260 are configured to decouple noise of a frequency range from about 1 MHz to less than about 1 GHz. In some arrangements, the capacitors 250 and 260 may be made of or include ceramic materials. The capacitors 250 and 260 may be or include multi-layer ceramic capacitors (MLCC). In some arrangements, the capacitor 270 is configured to decouple noise of a frequency at about 1 GHz or higher. In some arrangements, the capacitors 270 may be made of or include semiconductor materials (e.g., silicon-based materials). The capacitor 270 may be or include a deep trench capacitor (DTC). In some arrangements, the capacitors 250, 260, and 270 are electrically coupled in parallel with one another. In some arrangements, the capacitors 250 may be electrically coupled in parallel with one another in parallel to sum the capacitance contributed by the capacitor 250, the capacitors 260 may be electrically coupled in parallel with one another in parallel to sum the capacitance contributed by the capacitor 260, and the capacitors 270 may be electrically coupled in parallel with one another in parallel to sum the capacitance contributed by the capacitor 270. Each group of the capacitors 250, 260, and 270 may be electrically connected to one another in-series or in parallel according to actual needs for the capacitance values required for noise decoupling. In some arrangements, the capacitor 250, the capacitor 260, and the capacitor 270 have different capacitance values. In some arrangements, the capacitance value of the capacitor 250 is greater than the capacitance value of the capacitor 260, and the capacitance value of the capacitor 260 is greater than the capacitance value of the capacitor 270. In some arrangements, the capacitance value of the capacitor 230 is greater than the capacitance values of the capacitors 250, 260, and 270. In some arrangements, one or more of the capacitors 250 and 260 are electrically connected to the portion 110*p*1 of the power line 110*p*. In some arrangements, one or more of the capacitors 270 may be electrically connected to the portion 110*p*2 of the power line 110*p*. In some arrangements, the capacitor 270 is configured to operate at a frequency higher than that of the capacitor 260, and the capacitor 260 is configured to operate at the frequency higher than that of the capacitor 250. In some arrangements, the capacitor 230 is configured to operate at a frequency or a frequency range lower than that of the capacitors 250, 260, and 270. In some arrangements, an equivalent series resistance (ESR) of the capacitor 230 is greater than that of the capacitor 270, and the ESR of the capacitor 270 is greater than that of the capacitors 250 and 260. In some arrangements, the capacitance density of the capacitor 230 is lower than that of the capacitors 250 and 260, and the capacitance density of the capacitors 250 and 260 is lower than that of the capacitor 270. In some arrangements, referring to FIG. 1B, the capacitor 230 has a lateral side 230*s*1 horizontally overlapping at least two capacitors 250 from a top view perspective. In some arrangements, referring to FIG. 1B, the capacitor 230 further has a lateral side 230*s*2 non-parallel to the lateral side 230*s*1 and horizontally overlapping at least two capacitors 260 from a top view perspective. In some arrangements, the capacitors 250 are closer to the capacitor 230 than the capacitors 270 are, and the lateral side 230*s*1 of the capacitor 230 further horizontally overlaps at least two capacitors 270. In some arrangements, the capacitors 270 are closer to an edge 10*e* of the package structure 1 (or an edge of the substrate 10) than the capacitors 250 are. In some arrangements, referring to FIG. 1B, the capacitor 230 is disposed closer to a central region of the electronic component 30A than the capacitors 250 and 270 are.

In some arrangements, the filter portion 20F is configured to filter noise from the regulated power signal (or the second power signal). In some arrangements, the filter portion 20F is configured to filter noise from the regulated power signal (or the second power signal) at and above a predetermined frequency (also referred to as "a second frequency") higher than the predetermined frequency (or the first frequency) for the regulated power signal (or the second power signal).

The electronic components 30A and 30B may be disposed over the substrate 10. In some arrangements, the electronic component 30A vertically overlaps the filter portion 20F of the power module 20. In some arrangements, the electronic component 30A is electrically connected to the filter portion 20F. In some arrangements, the electronic component 30A vertically overlaps the portion 110*p*2 of the power line 110*p* of the circuit structure 10R. The electronic component 30A may include conductive pads 310 (e.g., conductive pillars) facing the substrate 10. In some embodiments, the electronic component 30A is or includes an active component. In some arrangements, the electronic component 30A includes an application-specific integrated circuit (ASIC), a controller, a processor, or other active electronic component or semiconductor device, or a combination thereof. The electronic component 30B may include conductive pads 320 (e.g., conductive pillars) facing the substrate 10. In some arrangements, the electronic component 30B is or includes a passive component. In some embodiments, the electronic component 30B is or includes a high bandwidth memory (HBM). In some arrangements, the electronic component 30A may be electrically connected to or communicate with the electronic component 30B via the RDL 50. In some arrangements, an operational frequency of the electronic component 30A is higher than a resonant frequency of the substrate 10.

The protective layer 40 may be embedded in the substrate 10 and encapsulate the power module 20. In some arrangements, the protective layer 40 is filled in the cavity 10C. In some arrangements, the power module 20 or the encapsulant 20M is spaced apart from the core layer 100 by the protective layer 40. The protective layer 40 may include an organic material, a solder mask, polyimide (PI), an ABF, one or more molding compounds, one or more pre-impregnated composite fibers (e.g., a pre-preg material), any combination thereof, or the like.

The RDL 50 may be between the electronic component 30A and the substrate 10. In some arrangements, the RDL 50 is between the electronic component 30A and the circuit structure 10R. In some arrangements, the RDL 50 includes a plurality of dielectric layers 510, conductive layers 520 disposed between the dielectric layers 510, and conductive vias 530 connecting the conductive layers 520. In some arrangements, the RDL 50 includes a conductive structure 50R which includes a portion of the conductive layers 520 and some of the conductive vias 530. In some arrangements, the conductive structure 50R vertically overlaps the electronic component 30A. In some arrangements, the conductive structure 50R vertically overlaps the portion 110*p*2 of the power line 110*p* of the circuit structure 10R. In some arrangements, the RDL 50 may be referred to as a high-density wiring structure.

The connection elements 60 may electrically connect the circuit structure 10R to the RDL 50. In some arrangements, the circuit structure 10R includes a conductive pad 110*c* (i.e., one of the circuit layers 110L) disposed on or exposed by an upper surface of the dielectric layer 120. The conductive pad 110*c* may be electrically connected to the power line 110*p*. The conductive pad 110*c* may be a portion of the power line 110*p*. In some arrangements, the connection element 60 electrically connects the conductive pad 110*c* to the RDL 50. The connection elements 60 may be or include conductive bumps or stub bumps including gold (Au), silver (Ag), copper (Cu), another metal, a solder alloy, or a combination of two or more thereof.

The connection elements 70 may electrically connect the RDL 50 to the electronic components 30A and 30B. In some arrangements, the connection elements 70 are electrically connected to the conductive pads 310 and 320. In some arrangements, some of the conductive vias 530 are exposed by an upper surface of the dielectric layer 510. The conductive vias 530 may be electrically connected to the electronic components 30A and 30B via the connection elements 70. In some arrangements, the conductive structure 50R of the RDL 50 electrically connects the portion 110*p*2 of the power line 110*p* to the electronic component 30A via the connection elements 60 and 70. The connection elements 70 may be or include conductive bumps or stub bumps including Au, Ag, Cu, another metal, a solder alloy, or a combination of two or more thereof.

The electrical contacts 80 may be disposed under the substrate 10. In some arrangements, the electrical contacts 80 connect or contact the bottom surface 10Rb of the circuit structure 10R. In some arrangements, a bottommost one of the circuit layers 130L is exposed by the dielectric layer 140 and electrically connects to or directly contacts the electrical contacts 80. The electrical contacts 80 may be configured to provide electrical connections between the package structure 1 and external components (e.g. external circuits or circuit boards). The electrical contacts 80 may be or include solder balls. The electrical contacts 80 may be or include controlled collapse chip connection (C4) bumps, a ball grid array (BGA), or a land grid array (LGA).

The underfill 90 may be between the substrate and the RDL 50. In some arrangements, the underfill 90 encapsulates the connection elements 60. The underfill 90 may be or include epoxy resin, a molding compound (e.g., an epoxy molding compound or other molding compound), polyimide, a phenolic compound or material, a material including a silicone dispersed therein, or a combination thereof.

The encapsulant 92 may be disposed over the RDL 50. In some arrangements, the encapsulant 92 encapsulates the connection elements 70 and the electronic components 30A and 30B. The encapsulant 92 may include an organic material, a solder mask, polyimide (PI), an ABF, one or more molding compounds, one or more pre-impregnated composite fibers (e.g., a pre-preg material), any combination thereof, or the like.

The conductive layers, portions, patterns, pads, pillars, liners, and/or vias described herein may independently include a conductive material such as a metal or metal alloy. Examples include Au, Ag, Al, Cu, or an alloy thereof. The dielectric layers described herein may independently include an organic material, a solder mask, PI, an ABF, one or more molding compounds, one or more pre-impregnated composite fibers (e.g., a pre-preg material), borophosphosilicate glass (BPSG), silicon oxide, silicon nitride, silicon oxynitride, undoped silicate glass (USG), any combination thereof, or the like.

Referring to FIG. 1A and FIG. 1B, in some arrangements, the circuit structure 10R of the substrate 10 is configured to define a power path P1 for supplying a power signal to the electronic component 30A. In some arrangements, the power path P1 passes the regulation portion 20R and connects to the filter portion 20F in parallel, and the filter portion 20F is configured to decouple noise from a regulated power signal transmitted from the regulation portion 20R and then transmit the decoupled regulated power signal to the electronic component 30A. In some arrangements, the power path P1 passes the regulator element 210 and at least a portion (e.g., the power line 110*p*) of the circuit structure 10R that electrically connects to at least one capacitor (e.g., one or more of the capacitors 230, 250, 260, and 270) in order. In some arrangements, the portion 110*p*1 of the power line 110*p* is electrically connected to the capacitor 250, the portion 110*p*2 of the power line 110*p* is electrically connected to the capacitor 270, and the power path P1 passes the portion 110*p*1 and the portion 110*p*2 of the power line 110*p* in order. In some arrangements, the power path P1 further passes the conductive structure 50R of the RDL 50. In some arrangements, the power path P1 passes the portion 130R2 of the circuit structure 10R, the regulator element 210, the portion 130R1, the inductor 220, a portion of the power line 110*p* that electrically connects to the capacitor 230, the portion 110*p*1 of the power line 110*p*, the portion 110*p*2 of the power line 110*p*, the portion 110R (or the connection element) of the circuit structure 10R, the connection element 60, the conductive structure 50R of the RDL 50, and the connection element 70 to reach the electronic component 30A.

Referring to FIG. 1A and FIG. 1B, in some arrangements, the power path P1 includes a path portion P11 and a path portion P12. In some arrangements, the path portion P11 extends from the regulation portion 20R to the filter portion 20F, and the path portion P12 extends from the filter portion 20F to the electronic component 30A. In some arrangements, the path portion P11 may be or include a horizontal path portion that extends from the regulation portion 20R to the filter portion 20F. In some arrangements, the path portion P11 extends in a direction substantially parallel to a top surface (e.g., the top surface 10Ra of the circuit structure 10R) of the substrate 10 that faces the electronic component 30A. In some arrangements, the path portion P11 extends in a direction substantially parallel to an extending direction of the power line 110*p*. In some arrangements, an angle formed between the extending directions of the path portions P11 and P12 may be greater than 45°, 50°, 55°, 60°, 65°, 70°, 75°, 80°, or 85°. In some arrangements, the path portion P12 extends in a direction substantially perpendicular to the extending direction of the path portion P11. In some arrangements, the path portion P12 is or includes a vertical segment that passes a portion (e.g., the conductive structure 50R) of the RDL 50 (or the high-density wiring structure). In some arrangements, a path length of the path portion P11 is greater than a path length of the path portion P12. In some arrangements, referring to FIG. 1B, the regulation portion 20R is between at least two segments of the filter portion 20F from a top view perspective. In some arrangements, the filter portion 20F surrounds the regulation portion 20R from a top view perspective.

In some arrangements, the capacitor 230 is coupled in parallel with the electronic component 30A. In some arrangements, the capacitors 250, 260, and 270 are coupled in parallel with the electronic component 30A. An initial power signal transmitted from the power supply may include a power signal generated by the power supply and noise signals generated simultaneously. As the initial power signal passes the regulation portion 20R (or the VRM), in addition to the power signal being regulated, some noise signals bypass the capacitor 230 while the regulated power signal keeps passing along the power path P1 (or transmitting by the power line 110*p*), such that these noise signals are decoupled from the transmitted power signal. Next, the regulated power signal keeps passing along the power path P1 (or transmitting by the power line 110*p*), and more noise signals bypass the capacitor 250, the capacitor 260, and the capacitor 270 while the regulated power signal keeps passing along the power path P1 (or transmitting by the portion 110R of the circuit structure 10R). In some arrangements, the noise bypassing the capacitor 270 is at a frequency higher than that of the noise bypassing the capacitor 260. In some arrangements, the noise bypassing the capacitor 260 is at a frequency higher than that of the noise bypassing the capacitor 250. In some arrangements, the noise bypassing the capacitor 250 is at a frequency higher than that of the noise bypassing the capacitor 230. In some arrangements, the capacitor 270 configured to decouple noise at a frequency higher than those of the other capacitors 230, 250, and 260 of the power module 20. In some arrangements, the capacitor 230 is configured to decouple noise of a frequency range from about 1 KHz to less than less than about 1 MHz. In some arrangements, the capacitors 250 and 260 are configured to decouple noise of a frequency range from about 1 MHz to less than less than about 1 GHz. In some arrangements, the capacitor 270 is configured to decouple noise of a frequency at about 1 GHz or higher. In some arrangements, the capacitor 270 is disposed closer to the portion 110R than the other capacitors 230, 250, 260. In some arrangements, the capacitor 270 is disposed closer to the conductive structure 50R than the other capacitors 230, 250, 260. In some arrangements, the capacitor 270 is configured to decouple high frequency noises, which may affect the electronic component 30A, from the power signal.

Figure 1C:
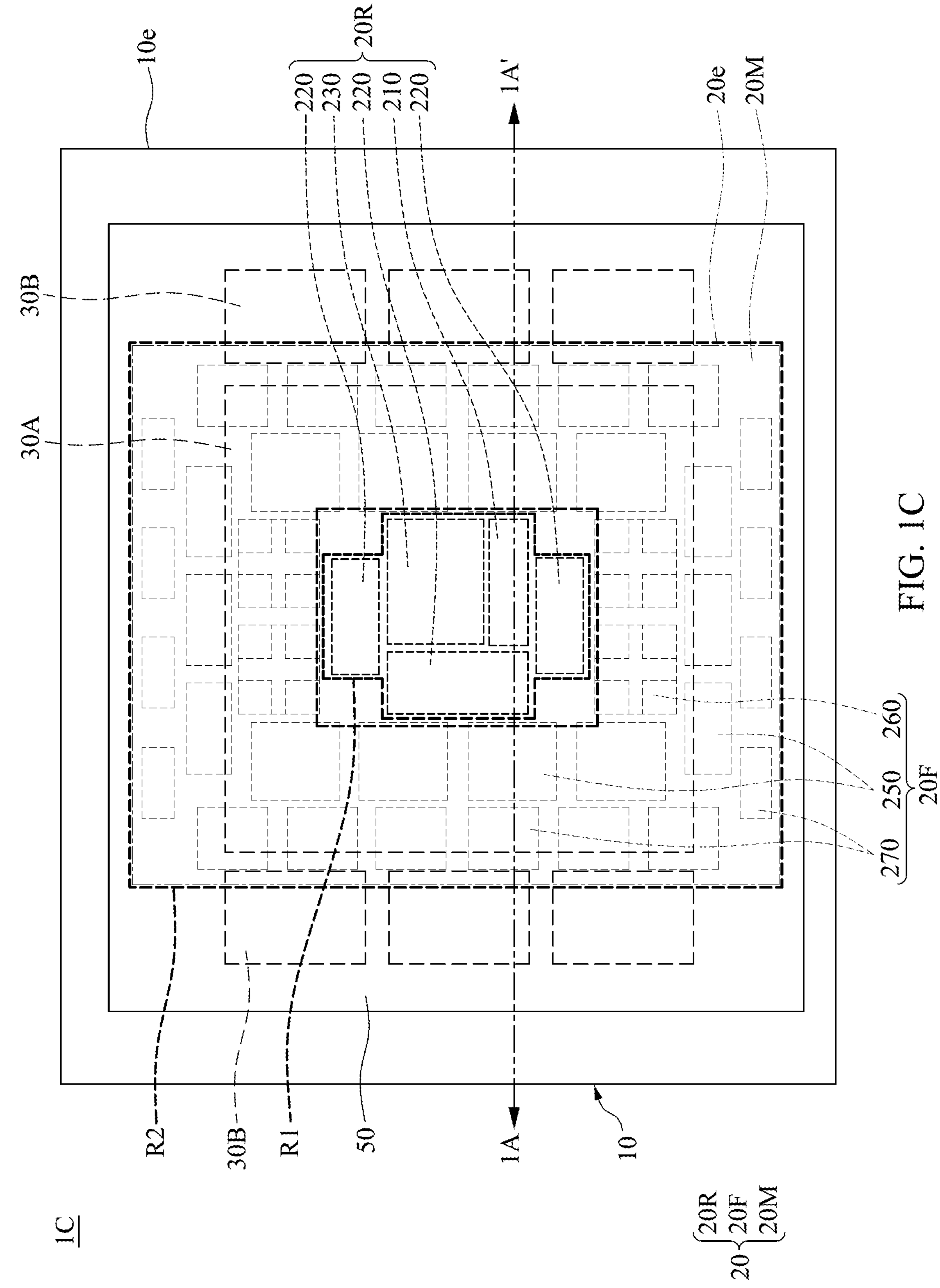
FIG. 1C is a top view of a package structure in accordance with some arrangements of the present disclosure.

FIG. 1C is a top view of a package structure 1C in accordance with some arrangements of the present disclosure. In some arrangements, FIG. 1A shows a cross-section along the line 1A-1A' in FIG. 1C. The package structure 1C illustrated in FIG. 1C is similar to that in FIGS. 1A-1B, with differences therebetween as follows.

In some arrangements, the regulation portion 20R includes a plurality of serial inductors 220. In some arrangements, the region R1 has a cross shape instead of a rectangular shape as illustrated in FIG. 1B.

Figure 1D:
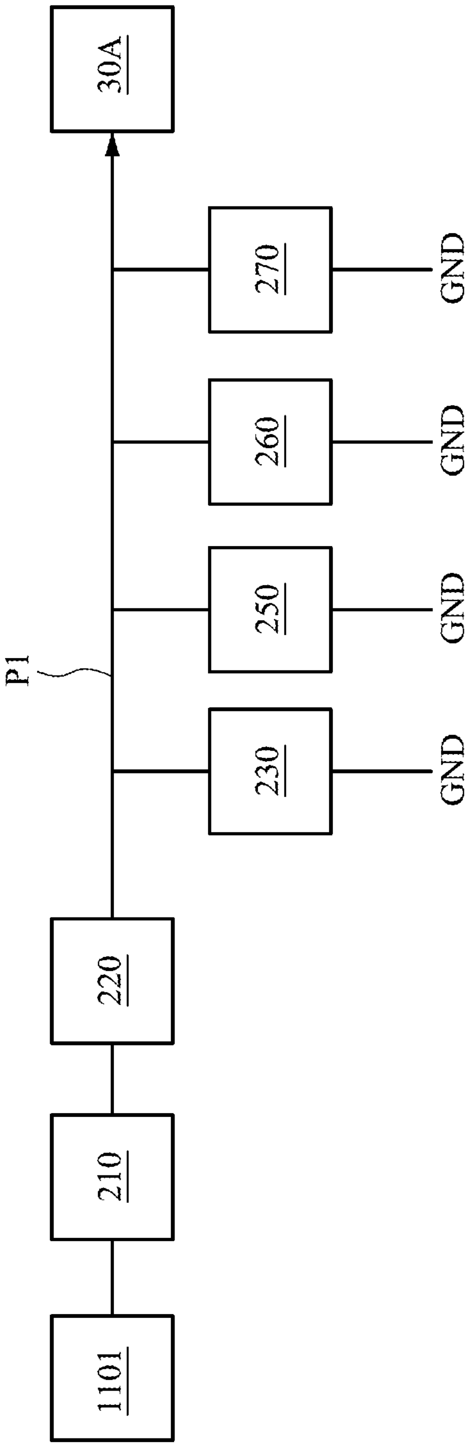
FIG. 1D is a schematic power transmission diagram of a package structure in accordance with some arrangements of the present disclosure.

FIG. 1D is a schematic power transmission diagram of a package structure 1 in accordance with some arrangements of the present disclosure.

In some arrangements, a power signal may be transmitted from a power supply 1001 along the power path P1 to supply to the electronic component 30A. The power supply 1001 may be connected in series with the regulator element 210 and the inductor 220. The regulator element 210, the inductor 220, and the capacitor 230 collectively form a voltage regulation module (VRM). The VRM is connected in series with the power supply 1001 and the electronic component 30A. The capacitor 230 may be coupled between the power path P1 (or a portion of the power line 110*p* in FIG. 1A) and ground GND (or the ground line 130*g* in FIG. 1A). The capacitors 250 may be coupled between the power path P1 (or the portion 110*p*1 in FIG. 1A) and ground GND (or the ground line 130*g* in FIG. 1A). The capacitors 260 may be coupled between the power path P1 (or a portion of the power line 110*p* in FIG. 1A) and ground GND (or the ground line 130*g* in FIG. 1A). The capacitors 270 may be coupled between the power path P1 (or the portion 110*p*2 in FIG. 1A) and ground GND (or the ground line 130*g* in FIG. 1A). The capacitor 230 may be connected in parallel to the capacitors 250. The capacitors 250 may be connected in parallel to the capacitors 260. The capacitors 260 may be connected in parallel to the capacitors 270. Noise signals may bypass the capacitors 230, 250, 260, and 270 so as to be filtered or decoupled from the power signal transmitted to the electronic component 30A.

In some cases where capacitors are integrated in a package structure by disposing active elements and various capacitors in a cavity of the substrate followed by filling the cavity with a polymer-based material to form an encapsulation layer that encapsulates the active elements and various capacitors. However, the polymer-based material is thermally-pressed to turn into a flowable state to flow between the active elements and capacitors followed by being solidified by cooling to form the encapsulation layer, and thus the polymer-based encapsulation layer may not fully fill the cavity; therefore, voids may be formed within the package structure. On the other hand, when a polymer-based material having a relatively high flowability is used, the as-formed polymer-based layer may have insufficient rigidity and thus warpage of the package structure may occur. In addition, various elements may be formed of different materials having different CETs and thus may deform upon heating. The various elements may have different warpage levels and thus have non-uniform thicknesses and non-uniform upper surfaces. Therefore, vias that are formed to penetrate the molding layer to connect to the various elements may be too short to reach one or more recessed surfaces of one or more of the warpage elements or too deep to undesirably penetrate one or more concave surfaces of one or more of the warpage elements.

According to some arrangements of the present disclosure, the power module is a molded power module including various elements encapsulated by the encapsulant and embedded in the substrate. The encapsulant can provide a relatively sufficient rigidity to protect the elements from warpage upon heating, and thus elements with various CTEs can be molded into the power module, and warpage deviation between the various elements can be reduced. In addition, since the various elements are molded prior to being disposed in the cavity of the substrate, one does not have to choose an encapsulant material that has a high flowability in order to fully fill the cavity, and thus the costs can be reduce. In addition, known-good-elements can be picked-up to assemble into the molded power module. Therefore, the yield can be increased. Moreover, the molded power module and the substrate including the circuit structure can be manufactured separately at substantially the same time, and thus the cycle time can be reduced significantly.

In addition, according to some arrangements of the present disclosure, the arrangements of the decoupling capacitors can be designed according to their respective functions. For example, the decoupling capacitor that decouples noise of a relatively high frequency can be arranged closer to the electronic component or the conductive structure that connects to the electronic component, such that the high-frequency noise of the electronic component can be decoupled from the power signal that is transmitted to the electronic component more effectively and efficiently.

Figure 2A:
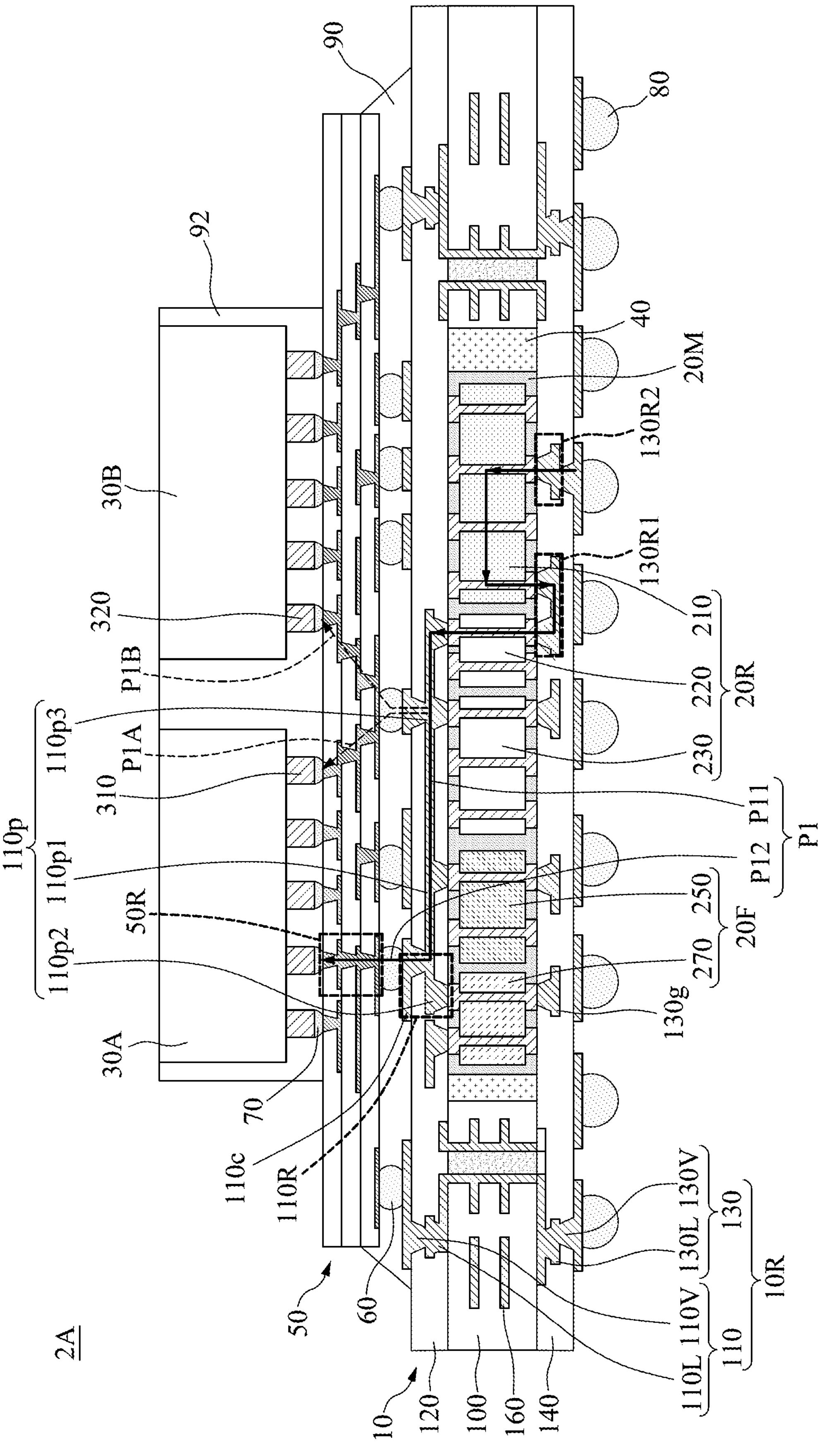
FIG. 2A is a cross-section of a package structure in accordance with some arrangements of the present disclosure.
Figure 2B:
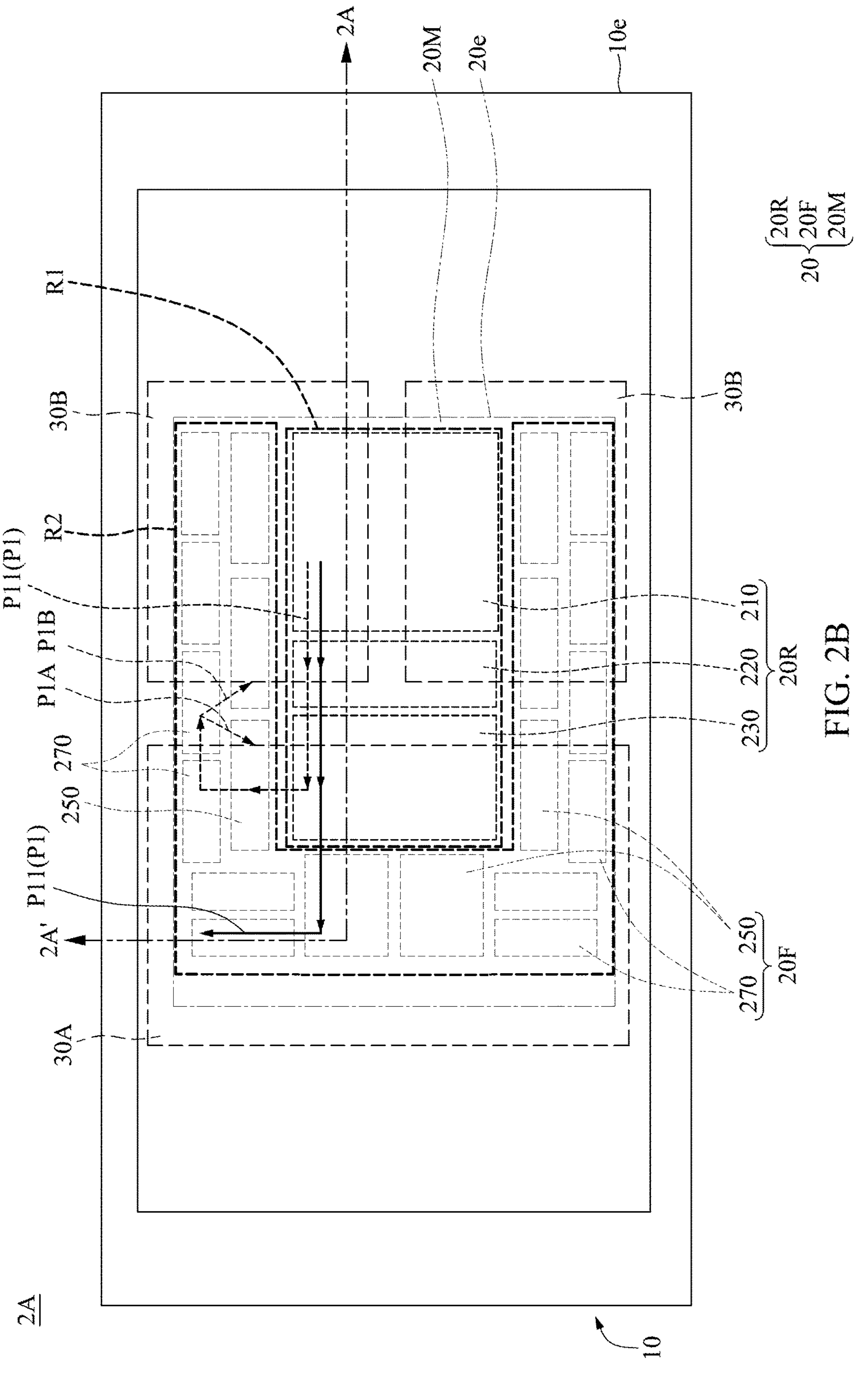
FIG. 2B is a top view of a package structure in accordance with some arrangements of the present disclosure.

FIG. 2A is a cross-section of a package structure 2A in accordance with some arrangements of the present disclosure. FIG. 2B is a top view of a package structure 2A in accordance with some arrangements of the present disclosure. In some arrangements, FIG. 2A shows a cross-section along the line 2A-2A' in FIG. 2B. The package structure 2A illustrated in FIGS. 2A-2B is similar to that in FIGS. 1A-1B, with differences therebetween as follows.

In some arrangements, the circuit structure 10R of the substrate 10 is configured to define a power path P1 for supplying a power signal to the electronic component 30A. In some arrangements, the power path P1 includes path portions P11 and P12. In some arrangements, an angle formed between the extending directions of the path portions P11 and P12 may be greater than 45°, 50°, 55°, 60°, 65°, 70°, 75°, 80°, or 85°. In some arrangements, the path portion P12 is substantially perpendicular to the path portion P11. In some arrangements, the path portion P12 is substantially perpendicular to the top surface (e.g., the top surface 10Ra of the circuit structure 10R) of the substrate 10 that faces the electronic component 30A. In some arrangements, the power line 110*p* (or the circuit layer) may include a plurality portions (e.g., portions 110*p*1, 110*p*2, and 110*p*3) electrically connected to each other and respectively electrically connected to various different electronic elements to connect the electronic elements in parallel. In some arrangements, the portion 110*p*1 of the power line 110*p* is electrically connected to the capacitor 250, the portion 110*p*2 of the power line 110*p* is electrically connected to the capacitor 270, the portion 110*p*3 of the power line 110*p* is electrically connected to the capacitor 230, and the power path P1 (or the path portion P11) passes the portion 110*p*3, the portion 110*p*1, and the portion 110*p*2 of the power line 110*p* in order. In some arrangements, the power path P1 (or the path portion P12) further passes the conductive structure 50R of the RDL 50. In some arrangements, the power path P1 passes the portion 130R2 of the circuit structure, the regulator element 210, the portion 130R1, the inductor 220, the portion 110*p*3 of the power line 110*p*, the portion 110*p*1 of the power line 110*p*, the portion 110*p*2 of the power line 110*p*, the portion 110R (or the connection element) of the circuit structure 10R, the connection element 60, the conductive structure 50R of the RDL 50, and the connection element 70 to reach the electronic component 30A.

In some arrangements, a portion of the filter portion 20F (or the noise filter module) is below a gap between the electronic component 30A and the electronic component 30B and configured to provide a decoupled power signal to the electronic component 30A and a decoupled power signal to the electronic component 30B. In some arrangements, the package structure 2A further defines power paths P1A and P1B for transmitting power signals (e.g., decoupled power signals) to the electronic component 30A and the electronic component 30B, respectively. In some arrangements, the power path P1A extends between the portion of the filter portion 20F (or the noise filter module) and the electronic component 30A, and the power path P1B extends between the portion of the filter portion 20F (or the noise filter module) and the electronic component 30B. In some arrangements, referring to FIG. 2A and FIG. 2B, power signals received from a power supply are transmitted by the power path P1 (or the path portion P11) to pass the regulation portion 20R to generate regulated power signals, and the regulated power signal are then decoupled by the filter portion 20F (e.g., the capacitors 250 and 270) to generated decoupled regulated power signals that reach the portion of the filter portion 20F (or the noise filter module) below a gap between the electronic component 30A and the electronic component 30B. Then, the decoupled regulated power signals may be transmitted by the power paths P1A and P1B to be supplied to the electronic component 30A and the electronic component 30B. In some arrangements, a path length of the path portion P11 is greater than a path length of the power path P1A and a path portion of the power path P1B.

In some arrangements, the power module 20 does not include the capacitors 260. In some arrangements, the region R2 partially surrounds the region R1. In some arrangements, the filter portion 20F partially surrounds the regulation portion 20R. In some arrangements, the region R2 has a U-shape instead of a rectangular shape as illustrated in FIG. 1B.

Figure 2C:
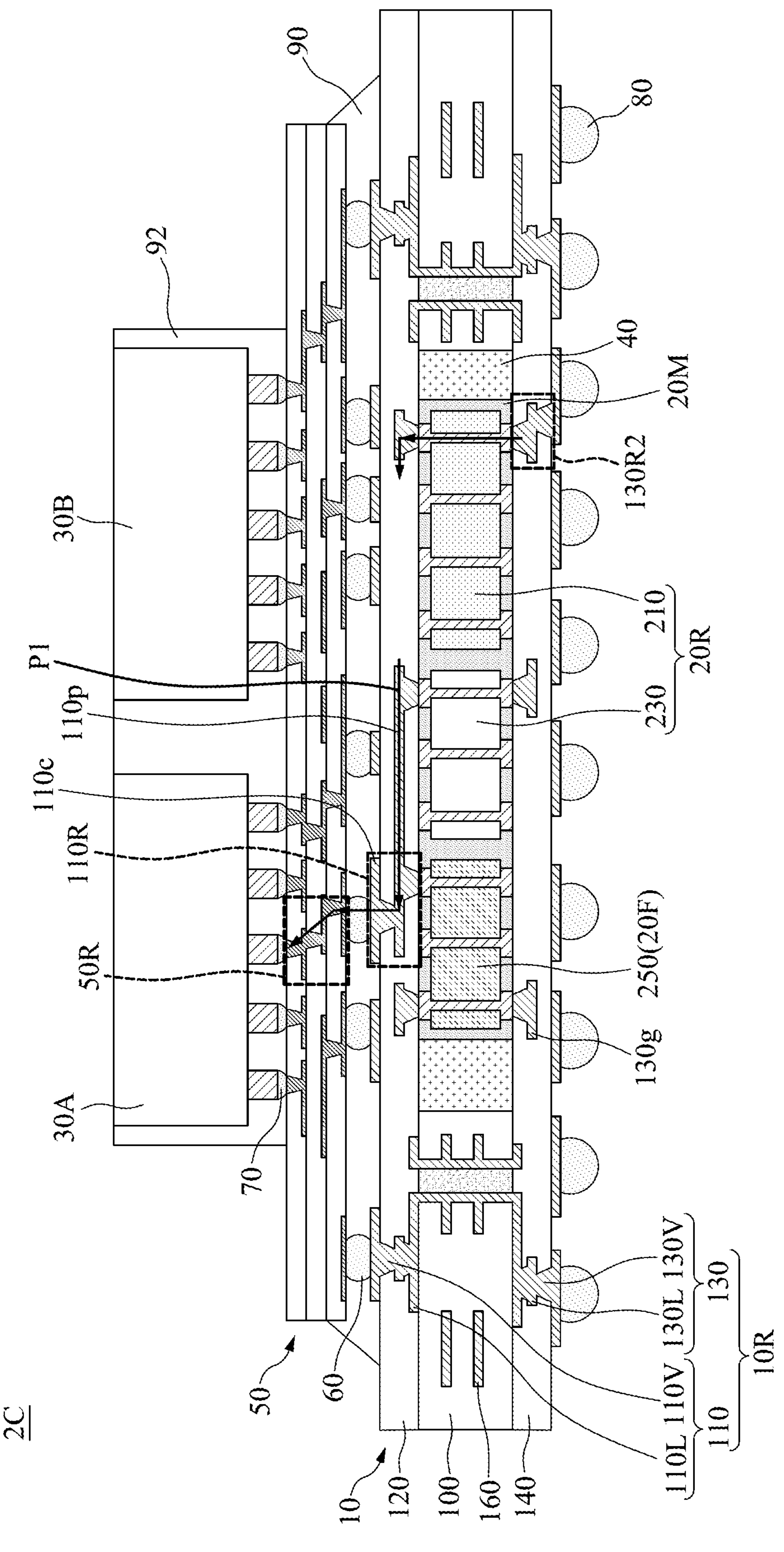
FIG. 2C is a cross-section of a package structure in accordance with some arrangements of the present disclosure.
Figure 2D:
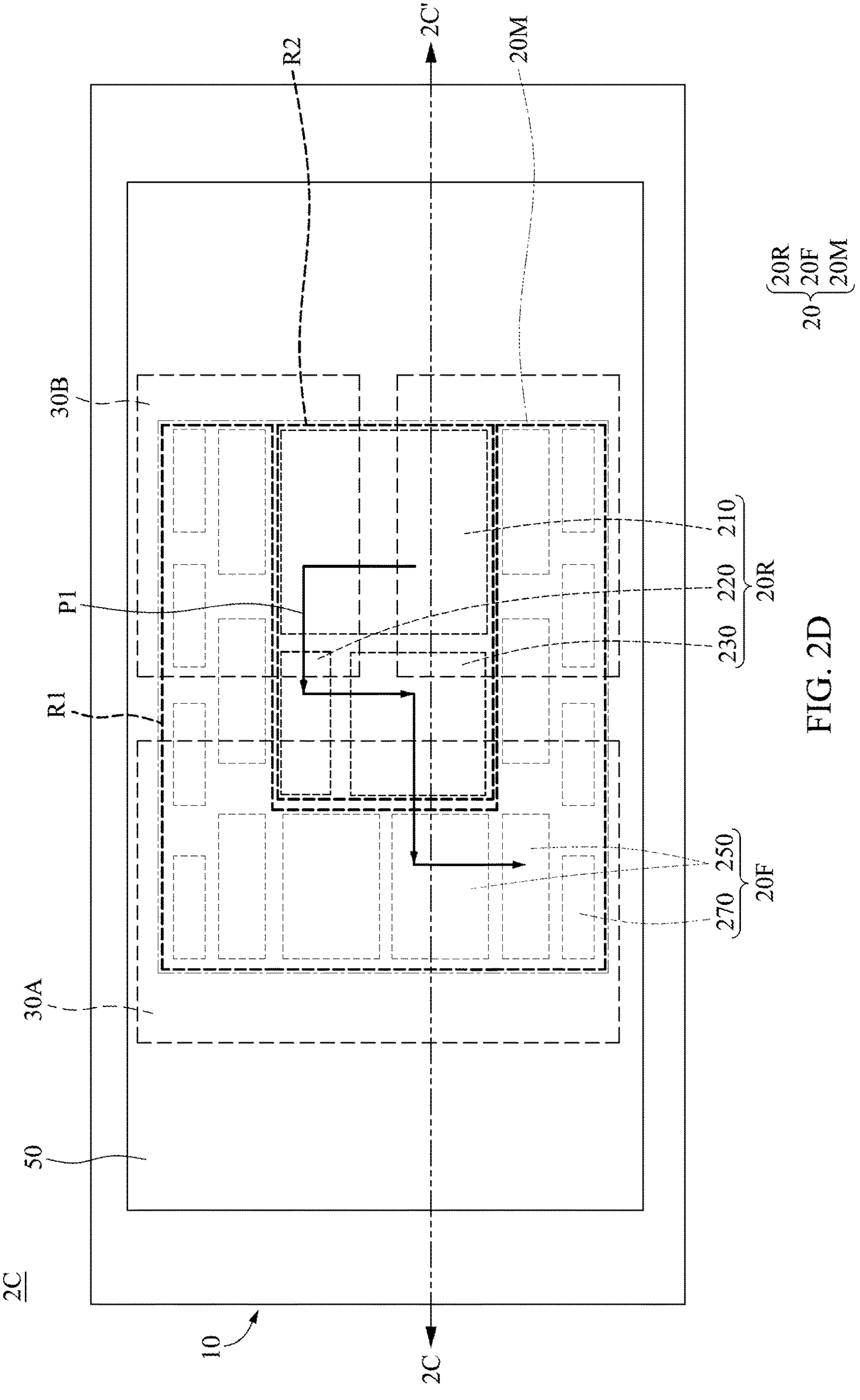
FIG. 2D is a top view of a package structure in accordance with some arrangements of the present disclosure.

FIG. 2C is a cross-section of a package structure 2C in accordance with some arrangements of the present disclosure. FIG. 2D is a top view of a package structure 2C in accordance with some arrangements of the present disclosure. In some arrangements, FIG. 2C shows a cross-section along the line 2C-2C' in FIG. 2A. The package structure 2C illustrated in FIGS. 2C-2D is similar to that in FIGS. 2A-2B, with differences therebetween as follows.

In some arrangements, the arrangement of the regulator element 210, the inductor 220, and the capacitor 230 of the package structure 2C is different from that of the package structure 2A. In some arrangements, the arrangement of the capacitors 250 and 270 of the package structure 2C is different from that of the package structure 2A.

Figure 3A:
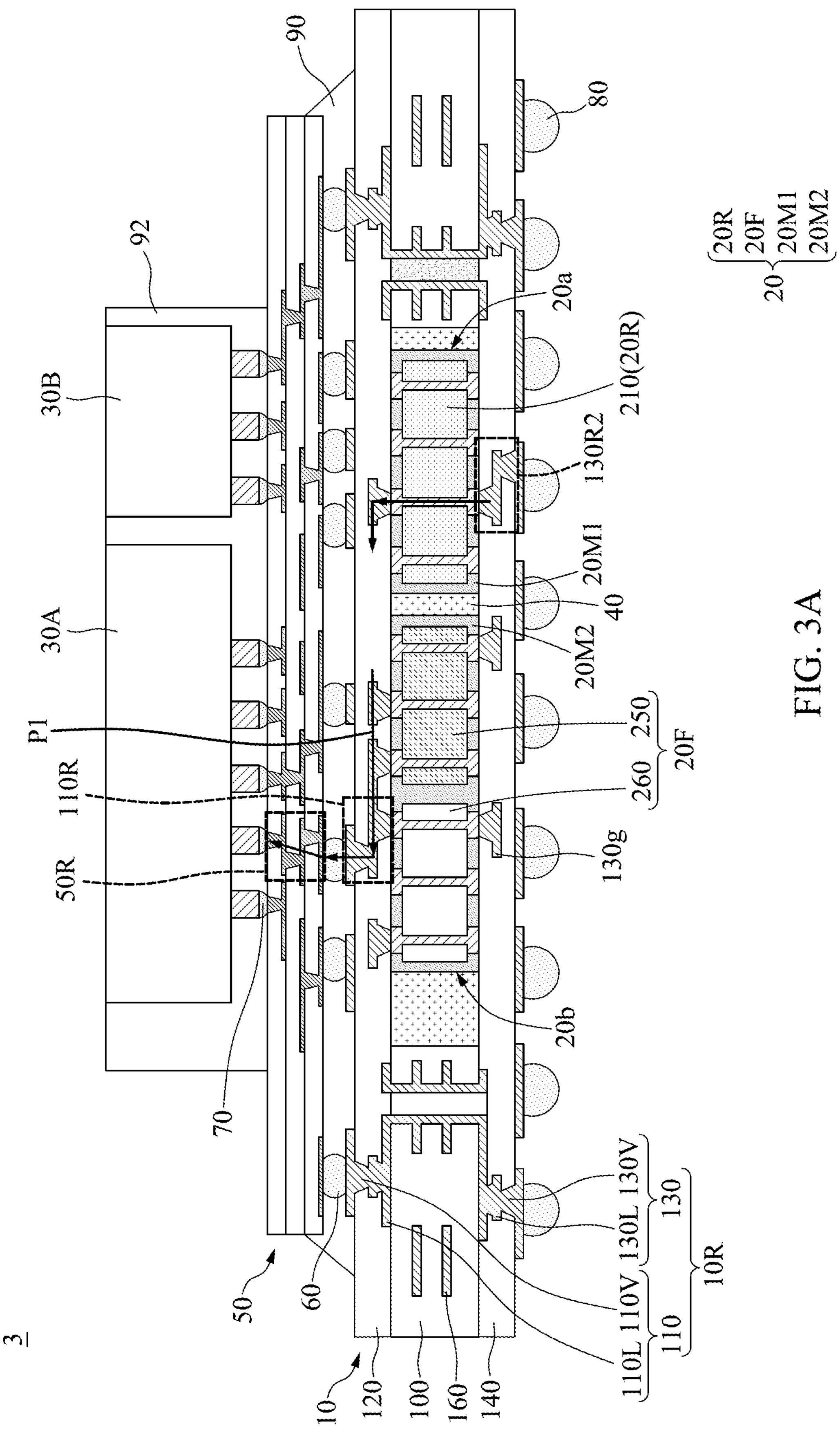
FIG. 3A is a cross-section of a package structure in accordance with some arrangements of the present disclosure.
Figure 3B:
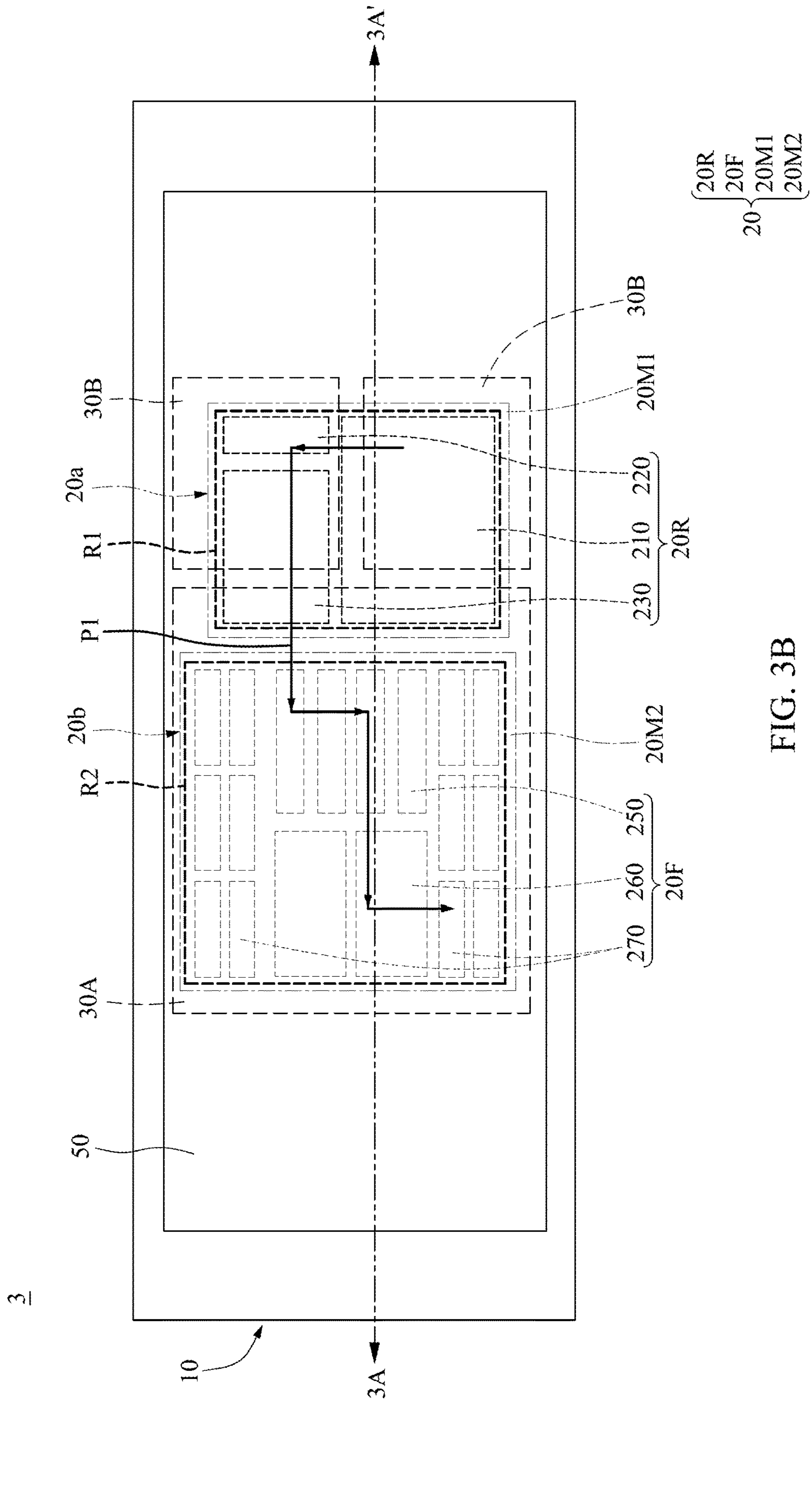
FIG. 3B is a top view of a package structure in accordance with some arrangements of the present disclosure.

FIG. 3A is a cross-section of a package structure 3 in accordance with some arrangements of the present disclosure. FIG. 3B is a top view of a package structure 3 in accordance with some arrangements of the present disclosure. In some arrangements, FIG. 3A shows a cross-section along the line 3A-3A' in FIG. 3B. The package structure 3 illustrated in FIGS. 3A-3B is similar to that in FIGS. 1A-1B, with differences therebetween as follows.

In some arrangements, the power module 20 includes a plurality of molded structures (e.g., molding structures 20*a* and 20*b*) each including an active element, a passive element, or a combination thereof. In some arrangements, the molded structures respectively include different types of passive elements. In some arrangements, the molded structures respectively include different types of decoupling capacitors configured to decouple noises at different frequency ranges. In some arrangements, the molded structures respectively have different coefficients of thermal expansion (CTEs). In some arrangements, the plurality of molded structures, respectively, include different types of passive elements, include different decoupling capacitors configured to decouple noises at different frequency ranges, include different groups of elements configured to provide different electrical functions, have different CTEs, or a combination thereof.

In some arrangements, the power module 20 includes molded structures 20*a* and 20*b*. In some arrangements, the molded structure 20*a* includes at least an active element (e.g., the regulator element 210), and the molded structure 20*b* includes a plurality of passive elements. (e.g., capacitors 250, 260, and 270). In some arrangements, the molded structure 20*a* includes the regulator element 210, the inductor 220, the capacitor 230, and an encapsulant 20M1 encapsulating the regulator element 210, the inductor 220, and the capacitor 230. In some arrangements, the molded structure 20*b* includes the capacitors 250, 260, and 270, and an encapsulant 20M2 encapsulating the capacitors 250, 260, and 270. In some arrangements, the molded structures 20*a* and 20*b* include different sets of passive elements.

Figure 3C:
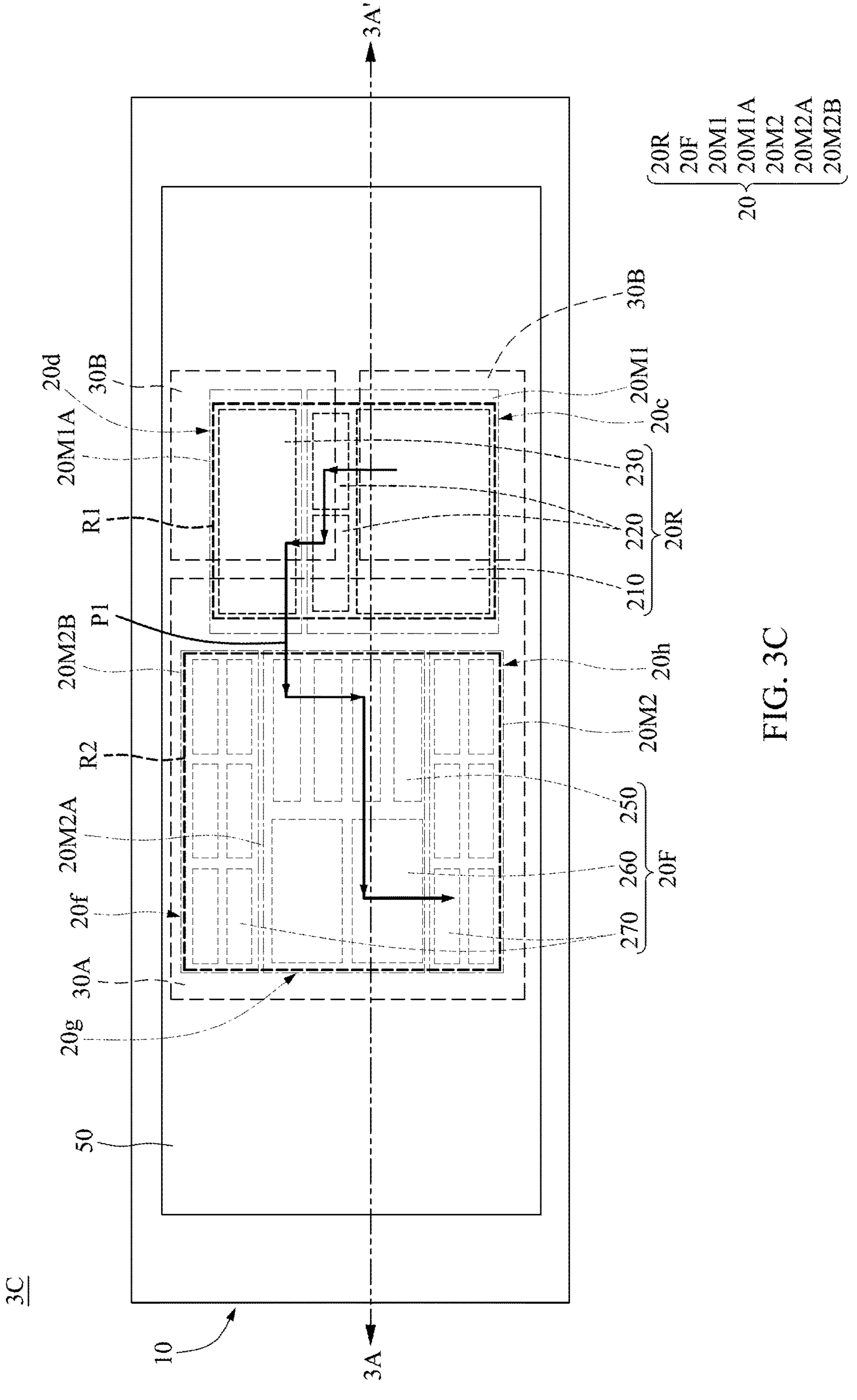
FIG. 3C is a top view of a package structure in accordance with some arrangements of the present disclosure.

FIG. 3C is a top view of a package structure 3C in accordance with some arrangements of the present disclosure. In some arrangements, FIG. 3A shows a cross-section along the line 3A-3A' in FIG. 3C. The package structure 3C illustrated in FIG. 3C is similar to that in FIGS. 3A-3B, with differences therebetween as follows.

In some arrangements, the power module 20 includes molded structures 20*c*, 20*d*, 20*f*, 20*g*, and 20*h*. In some arrangements, the molded structure 20*c* includes the regulator element 210 and an encapsulant 20M1 encapsulating the regulator element 210. In some arrangements, the molded structure 20*d* includes the inductor 220, the capacitor 230, and an encapsulant 20M1A encapsulating the inductor 220 and the capacitor 230. In some arrangements, the molded structure 20*h* includes the capacitors 270 and an encapsulant 20M2 encapsulating the capacitors 270. In some arrangements, the molded structure 20*g* includes the capacitors 250, the capacitors 260, and an encapsulant 20M2A encapsulating the capacitors 250 and 260. In some arrangements, the molded structure 20*f* includes the capacitors 270 and an encapsulant 20M2B encapsulating the capacitors 270. In some arrangements, the molded structures 20*c*, 20*d*, 20*f*, 20*g*, and 20*h* include different sets of elements with similar CTEs. In some arrangements, the molded structure 20*g* and the molded structures 20*f* and 20*h* include different decoupling capacitors configured to decouple noises at different frequency ranges. In some arrangements, the inductor 220 and the capacitor 230 may be made of materials having similar CTEs. In some arrangements, the capacitors 270 may be made of or include semiconductor materials (e.g., silicon-based materials) having similar CTEs and are molded in a single molded structure (e.g., the molded structures 20*f* and 20*h*). In some arrangements, the capacitors 250 and 260 may be made of or include ceramic materials having similar CTEs and are molded in a single molded structure 20*g*.

Figure 4:
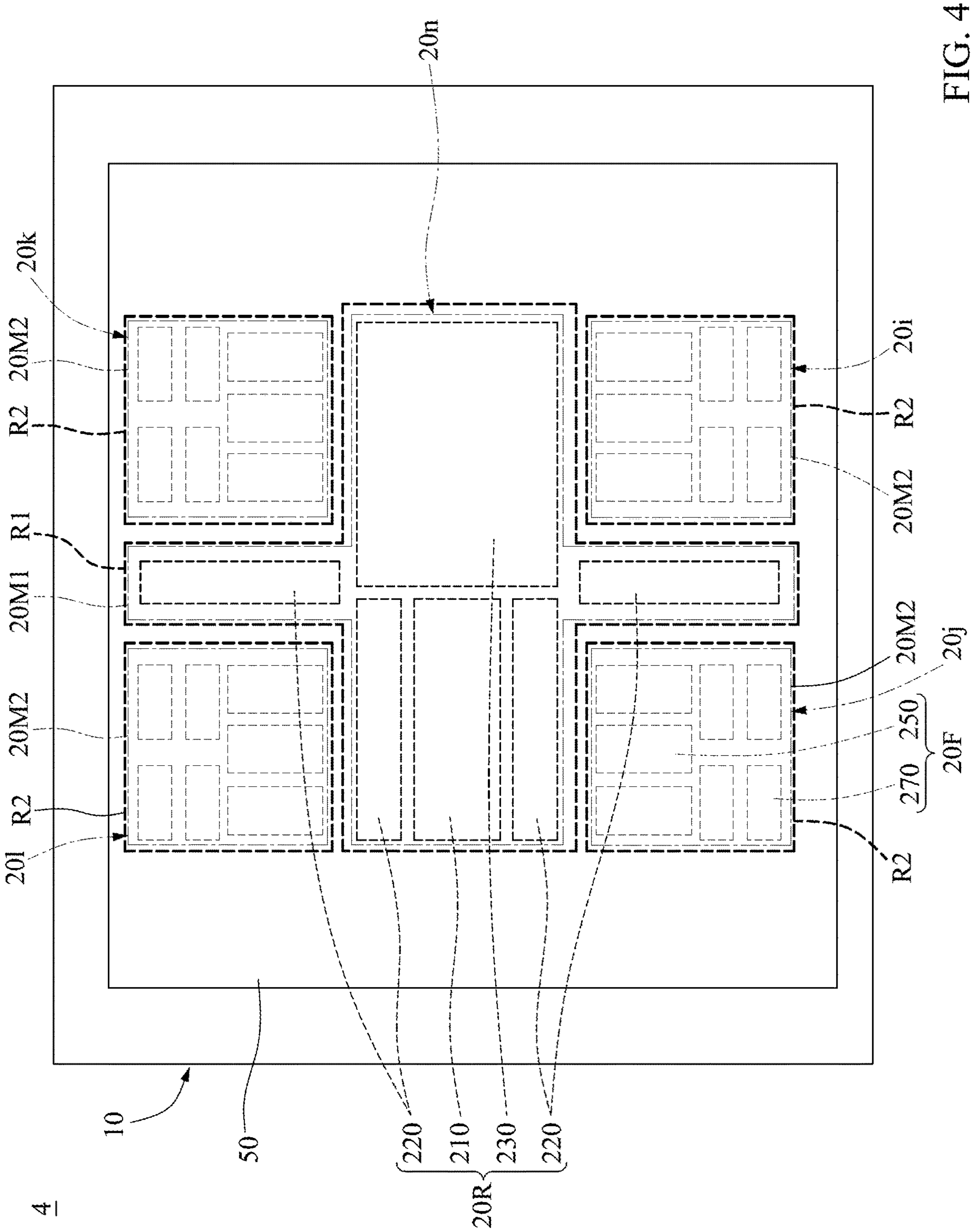
FIG. 4 is a top view of a package structure in accordance with some arrangements of the present disclosure.

FIG. 4 is a top view of a package structure 4 in accordance with some arrangements of the present disclosure. The package structure 4 illustrated in FIG. 4 is similar to that in FIGS. 1A-1B, with differences therebetween as follows. Please be noted that the electronic components 30A and 30B are omitted for clarity.

In some arrangements, the power module 20 includes molded structures 20*i*, 20*j* 20*k*, 201, and 20*n*. In some arrangements, the molded structure 20*n* includes the regulator element 210, the inductors 220, the capacitor 230, and an encapsulant 20M1 encapsulating the regulator element 210, the inductors 220, and the capacitor 230. In some arrangements, each of the molded structures 20*i*, 20*j* 20*k*, and 20*l* includes the capacitors 250 and 270 and an encapsulant 20M2 encapsulating the capacitors 250 and 270. In some arrangements, the molded structure 20*n* and the molded structures 20*i*, 20*j* 20*k*, and 20*l* include different groups of elements configured to provide different electrical functions.

Figure 5:
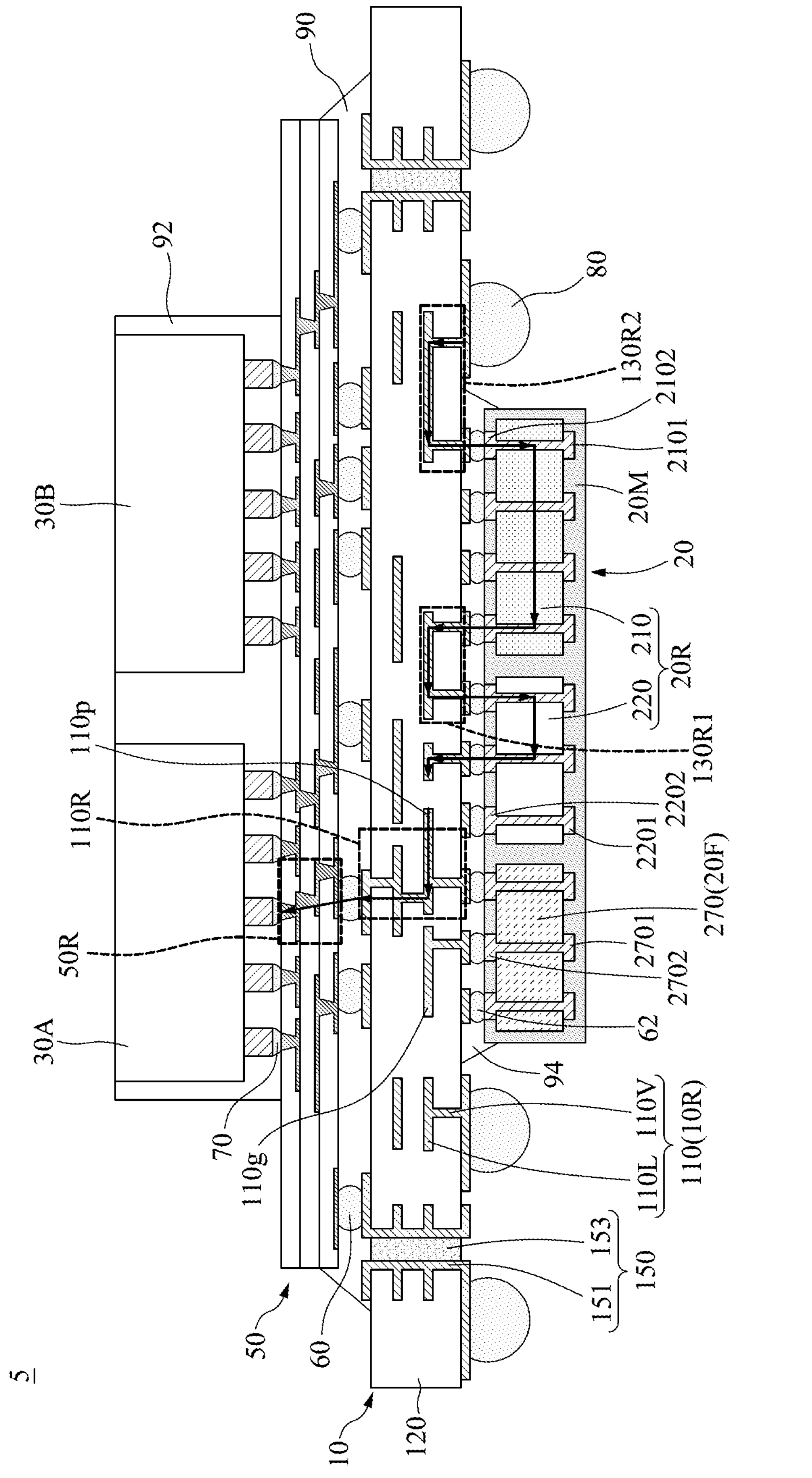
FIG. 5 is a cross-section of a package structure in accordance with some arrangements of the present disclosure.

FIG. 5 is a cross-section of a package structure 5 in accordance with some arrangements of the present disclosure. The package structure 5 illustrated in FIG. 5 is similar to that in FIGS. 1A-1B, with differences therebetween as follows.

In some arrangements, the substrate 10 includes a dielectric layer 120 and a circuit structure 10R. In some arrangements, the circuit structure 10R includes an upper structure 110 (also referred to as "a sub-structure"), conductive layers 160, and conductive vias 150. In some arrangements, the dielectric layer 120 may include plurality of sub-layers (not shown in drawings) laminated to each other. The conductive vias 150 penetrate the dielectric layer 120 and electrically connect the circuit layers 110L on opposite sides of the dielectric layer 120. In some arrangements, the conductive layers 160 are formed or disposed between the sub-layers of the dielectric layer 120 and may electrically connect to the conductive vias 150.

In some arrangements, the circuit structure 10R includes a power line 110*p* (i.e., one of the circuit layers 110L) configured to transmit a power signal and a ground line 110*g* (i.e., another one of the circuit layers 110L) configured to electrically connect one or more elements/components to ground. In some arrangements, the power line 110*p* and the ground line 110*g* are at a substantially same level and electrically disconnected to each other. In some arrangements, the circuit structure 10R includes at least portions 110R, 130R1, and 130R2 each configured to provide respective electrical connection functions. In some arrangements, each of the portions 110R, 130R1, and 130R2 includes a portion of the circuit layer 110L and one or more of the conductive vias 110V. In some arrangements, the portion 130R1 is electrically disconnected to the portion 130R2. In some arrangements, the portions 130R1 and 130R2 are electrically disconnected to the ground line 110*g*.

In some arrangements, the package structure 5 further includes connection elements 62 and an encapsulant 94. In some arrangements, the power module 20 is bonded to the substrate 10 by the connection elements 62, and the encapsulant 94 encapsulates the connection elements 62. The power module 20 may be referred to as a landside integrated hybrid component (I-IHC). The connection elements 62 may be or include conductive bumps or stub bumps including Au, Ag, Cu, another metal, a solder alloy, or a combination of two or more thereof. The encapsulant 94 may include an organic material, a solder mask, polyimide (PI), an ABF, one or more molding compounds, one or more pre-impregnated composite fibers (e.g., a pre-preg material), any combination thereof, or the like. Noise signals may be decoupled from the power signal that passes along or transmitted by the power line 110*p*. Noise signals may bypass the capacitors via the connection elements 62.

In some arrangements, the power path P1 passes the portion 130R2 of the circuit structure 10R, the regulator element 210, the portion 130R1, the inductor 220, a portion of the power line 110*p* that electrically connects to the capacitor 230, a portion of the power line 110*p* that electrically connects to the capacitor 270, the portion 110R (or the connection element) of the circuit structure 10R, the connection element 60, the conductive structure 50R of the RDL 50, and the connection element 70 to reach the electronic component 30A.

FIG. 6A, FIG. 6B, FIG. 6C, FIG. 6D, FIG. 6E, FIG. 6F, FIG. 6G, FIG. 6H, and FIG. 6I illustrate various stages of an exemplary method for manufacturing a package structure 2C in accordance with some embodiments of the present disclosure.

Figure 6A:
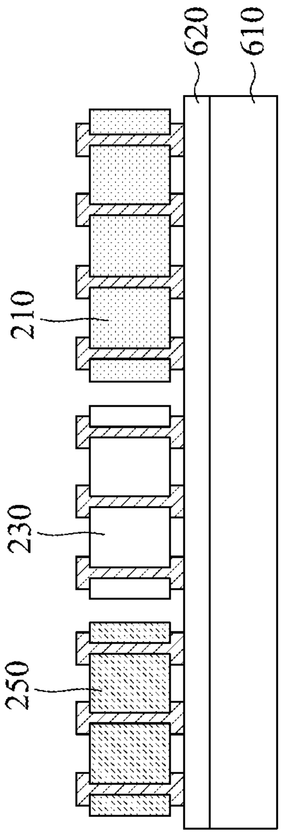
FIG. 6A, FIG. 6B, FIG. 6C, FIG. 6D, FIG. 6E, FIG. 6F, FIG. 6G, FIG. 6H, and FIG. 6I illustrate various stages of an exemplary method for manufacturing a package structure in accordance with some embodiments of the present disclosure.

Referring to FIG. 6A, a carrier 610 may be provided, a release film 620 may be disposed on the carrier 610, and a regulator element 210 and capacitors 230 and 250 may be disposed on the release film 620. The carrier 610 may be a rigid carrier configured to support the regulator element 210 and the capacitors 230 and 250. The carrier 610 may be or include a glass carrier. The release film 620 may be an adhesive layer for attaching the regulator element 210 and the capacitors 230 and 250 to the carrier 610.

Figure 6B:
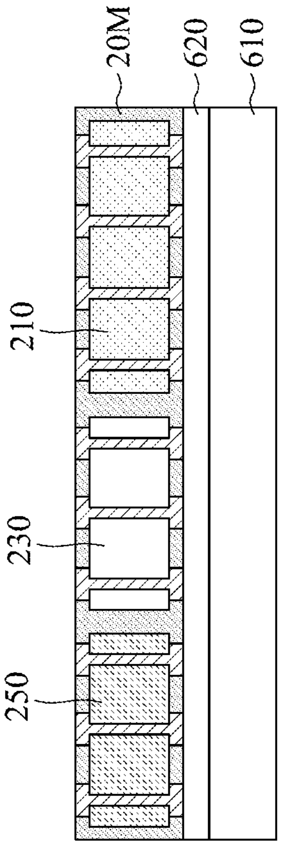

Referring to FIG. 6B, an encapsulant 20M may be disposed or formed to encapsulate the regulator element 210 and the capacitors 230 and 250.

Figure 6C:
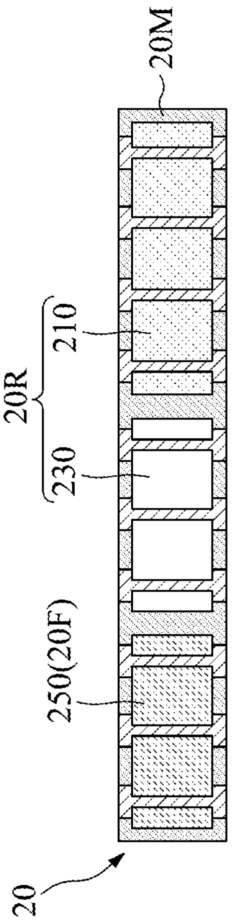

Referring to FIG. 6C, the release film 620 and the carrier 610 may be removed from the power module 20 which includes at least the regulator element 210 and the capacitors 230 and 250.

Figure 6D:
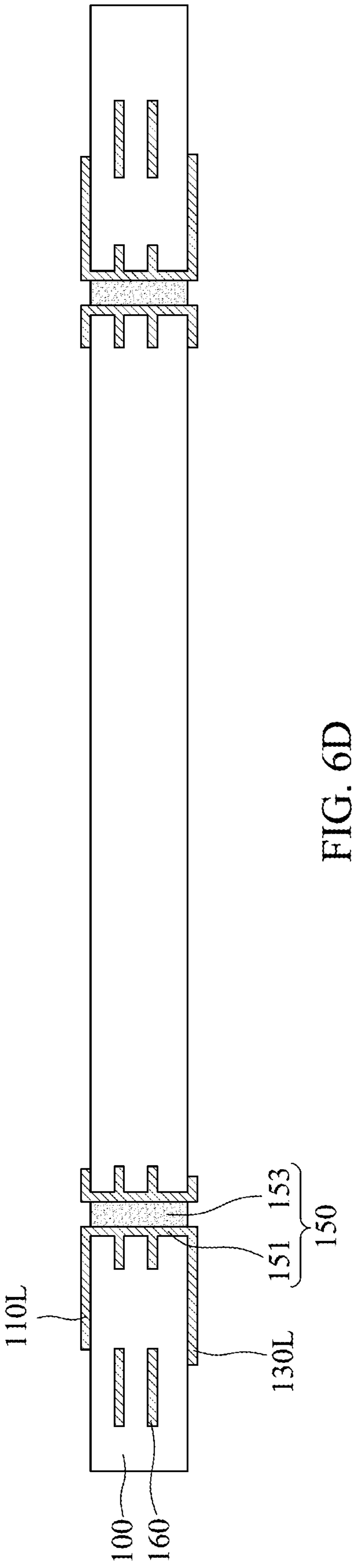

Referring to FIG. 6D, a substrate layer including a core layer 100, conductive vias 150 penetrating the core layer 100, circuit layers 110L and 130L on opposite surfaces of the core layer 100, and conductive layers 160 laminated between dielectric layers of the core layer 100 may be provided.

Figure 6E:
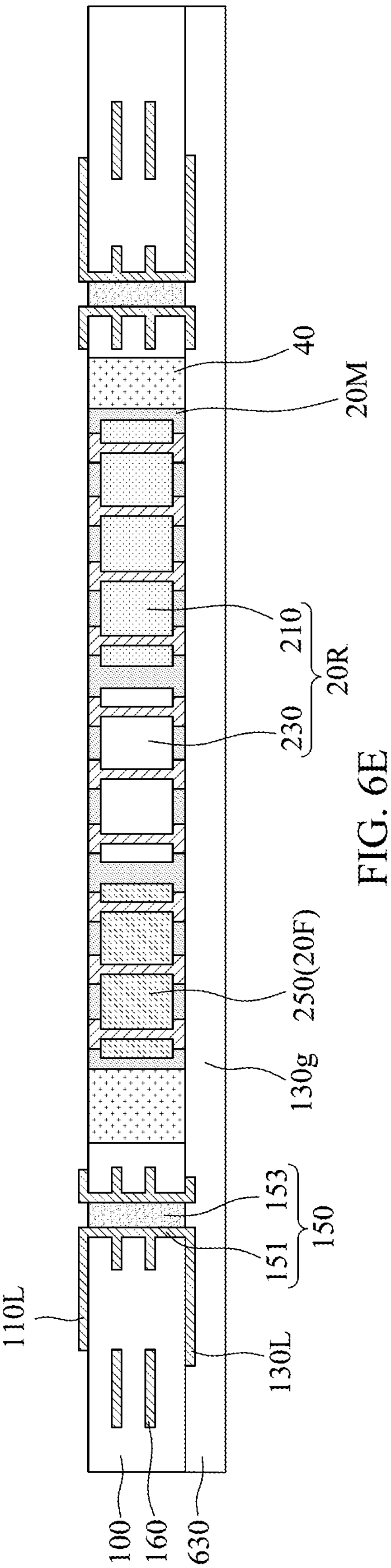

Referring to FIG. 6E, the substrate layer may be disposed on carrier 630. The carrier 630 may be or include a release film. The circuit layer 130L may be at least partially pressed into or embedded in the carrier 630. Next, a cavity may be formed to penetrate the core layer 100, the power module 20 may be disposed in the cavity, and a protective layer 40 may be formed to fill in the cavity.

Figure 6F:
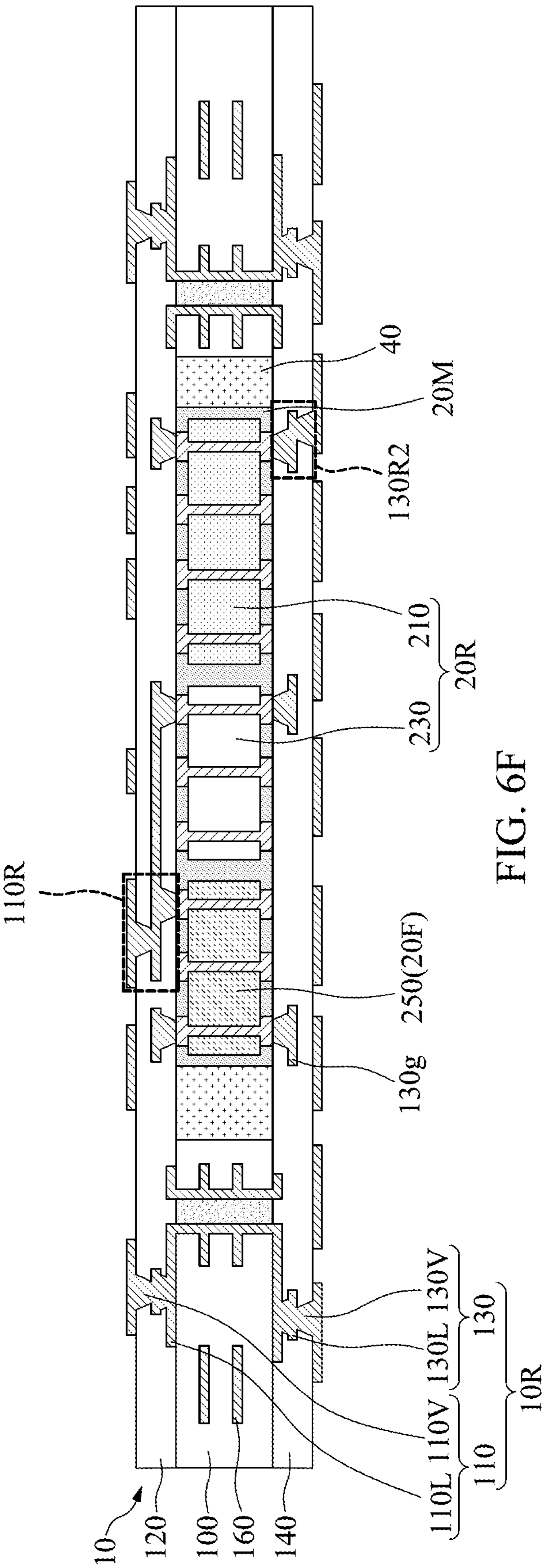

Referring to FIG. 6F, an upper structure 110 and a lower structure 130 may be formed on opposite surfaces of the substrate layer to form a substrate 10. In some arrangements, a lower structure 130 may be formed on the substrate layer, then the carrier 630 may be removed, the substrate layer with the lower structure 130 formed thereon may be flipped over, and then the upper structure 110 may be formed on the substrate layer.

Figure 6G:
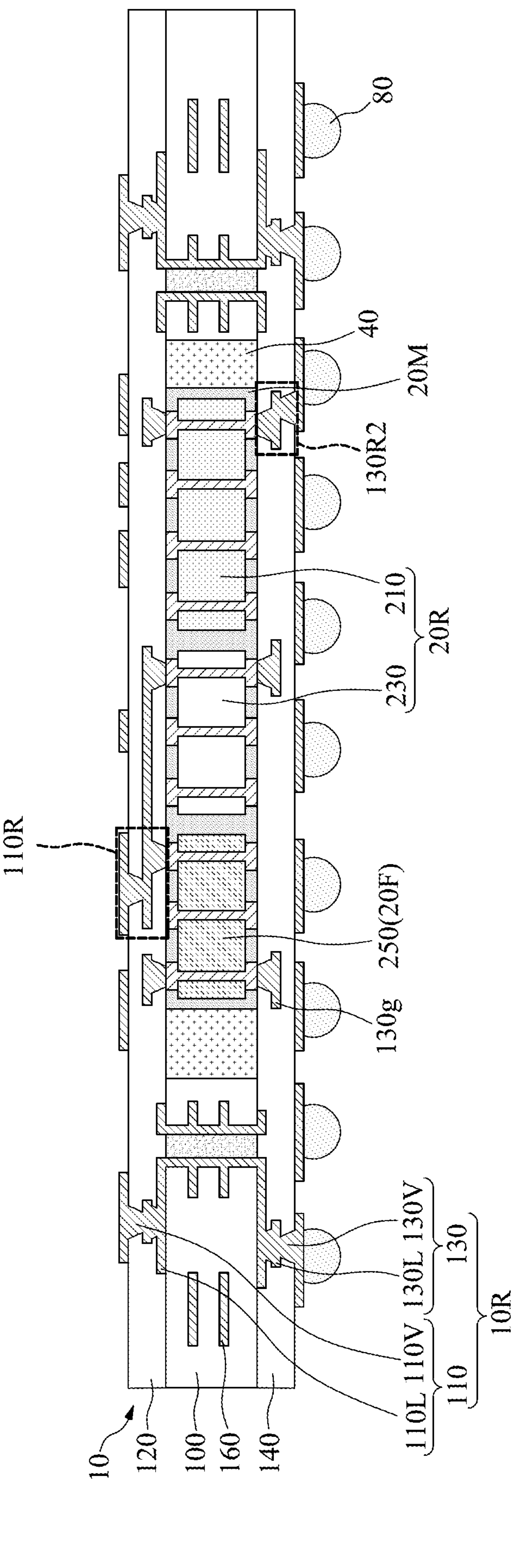

Referring to FIG. 6G, electrical contacts 80 may be disposed on the circuit layer 130L.

Figure 6H:
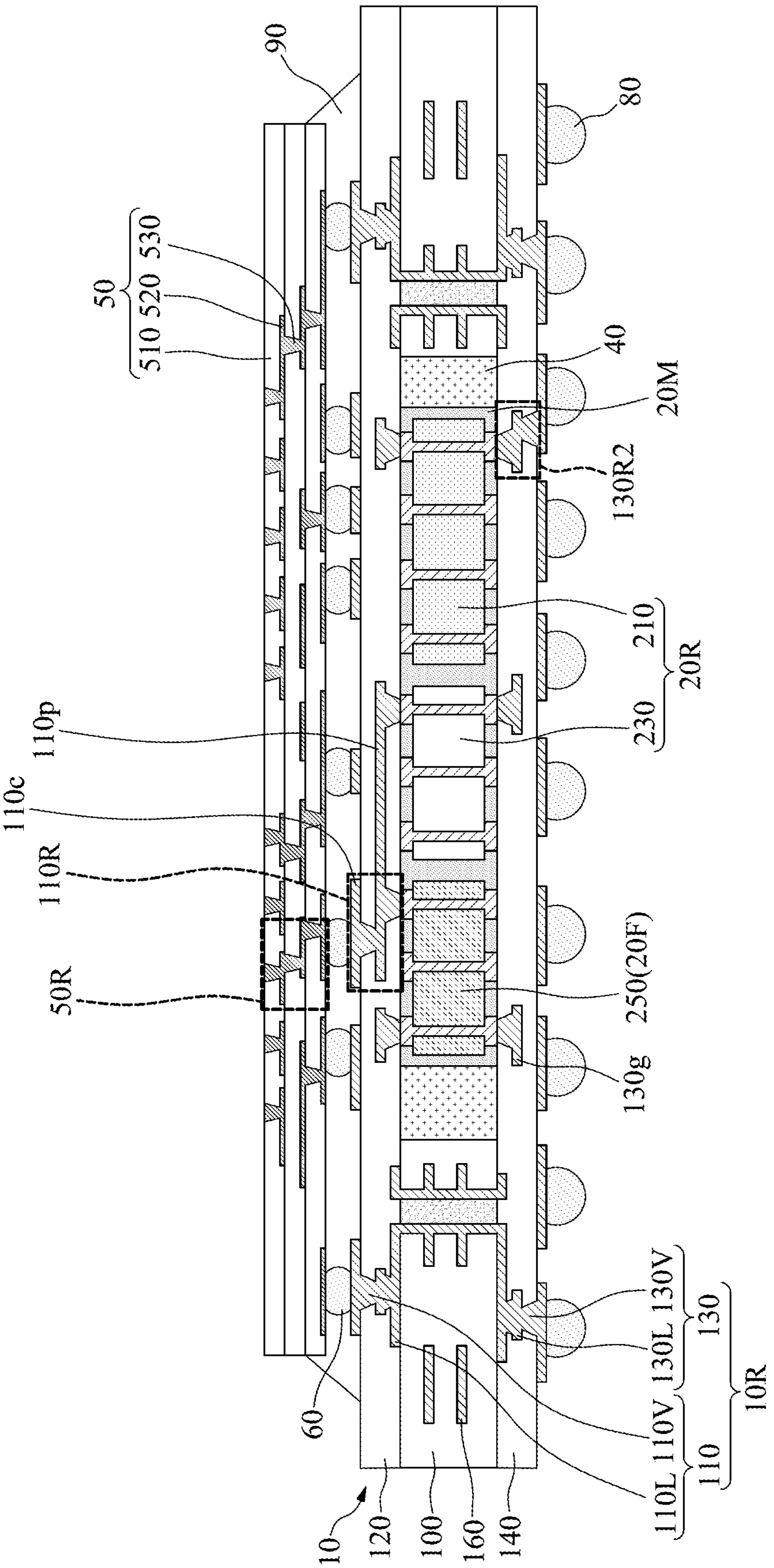

Referring to FIG. 6H, connection elements 60 may be disposed on the circuit layer 110L, an RDL 50 may be disposed on and electrically connected to the connection elements 60, and an underfill 90 may be formed or disposed to encapsulate the connection elements 60.

Figure 6I:
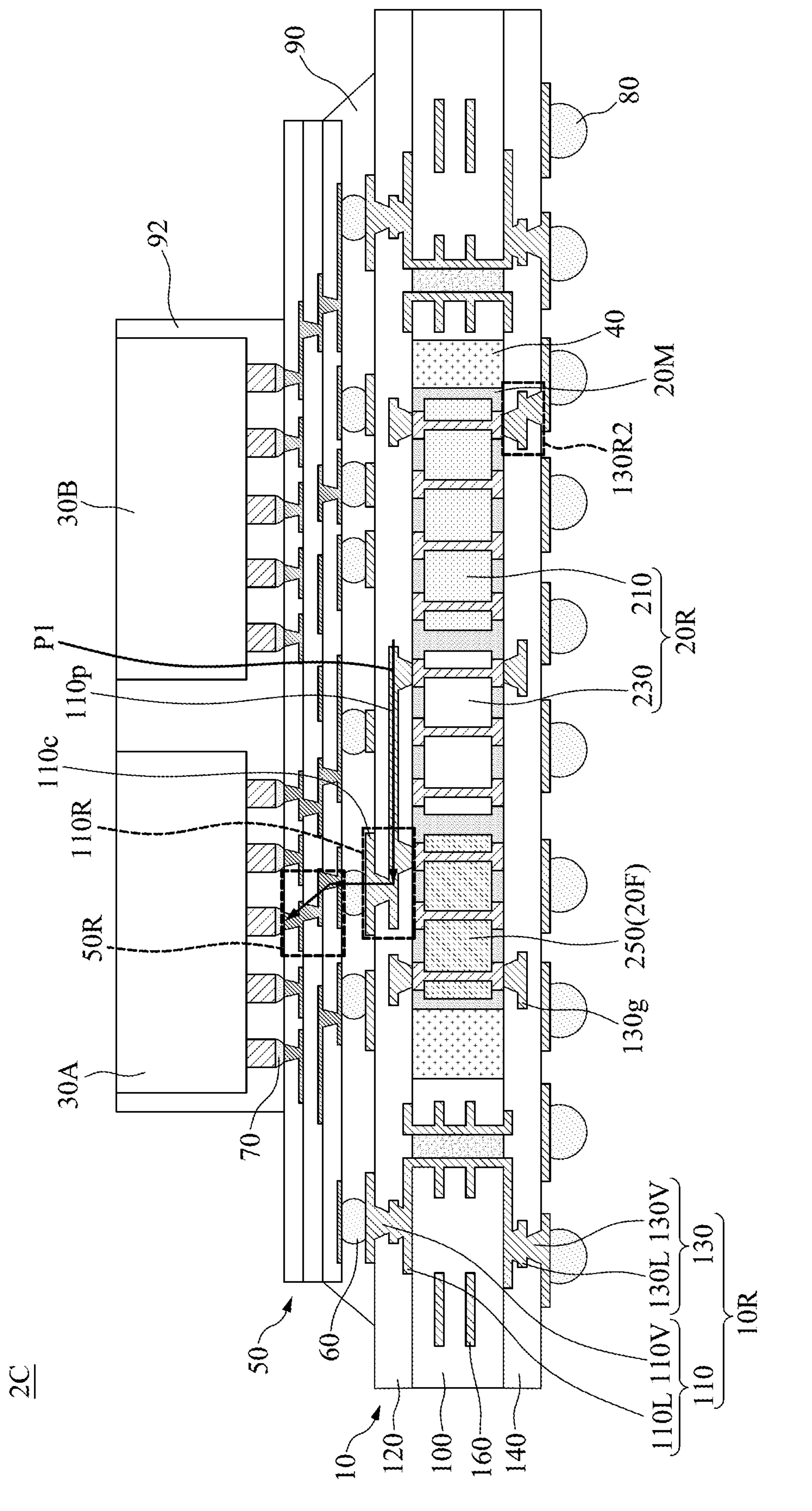

Referring to FIG. 6I, connection elements 70 may be disposed on the RDL 50, electronic components 30A and 30B may be disposed on and electrically connected to the connection elements 70, and an encapsulant 92 may be formed or disposed to encapsulate the electronic components 30A and 30B and the connection elements 70. As such, the package structure 2C is formed.

FIG. 7A, FIG. 7B, FIG. 7C, FIG. 7D, FIG. 7E, and FIG. 7F illustrate various stages of an exemplary method for manufacturing a package structure 5 in accordance with some embodiments of the present disclosure.

Figure 7A:
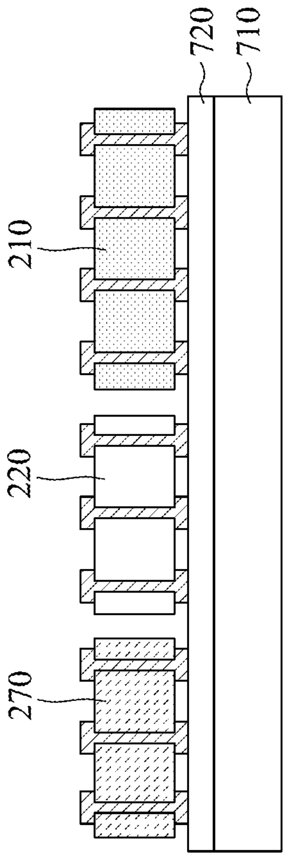
FIG. 7A, FIG. 7B, FIG. 7C, FIG. 7D, FIG. 7E, and FIG. 7F illustrate various stages of an exemplary method for manufacturing a package structure in accordance with some embodiments of the present disclosure.

Referring to FIG. 7A, a carrier 710 may be provided, a release film 720 may be disposed on the carrier 710, and a regulator element 210, an inductor 220, and a capacitor 270 may be disposed on the release film 720. The carrier 710 may be a rigid carrier configured to support the regulator element 210, the inductor 220, and the capacitor 270. The carrier 710 may be or include a glass carrier. The release film 720 may be an adhesive layer for attaching the regulator element 210, the inductor 220, and the capacitor 270.

Figure 7B:
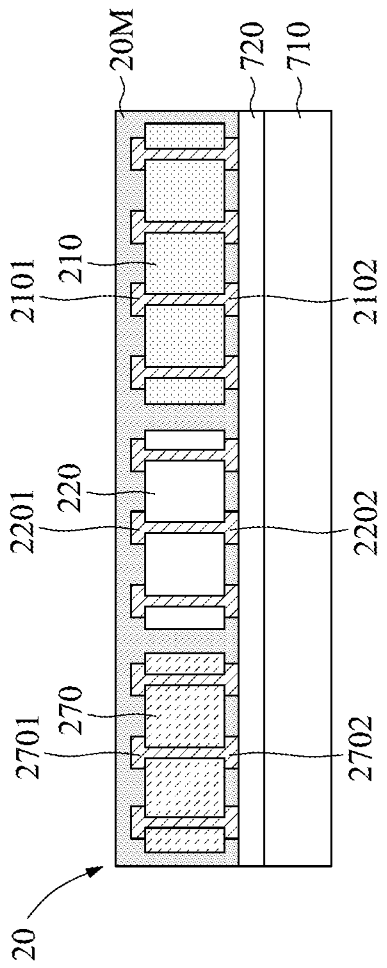

Referring to FIG. 7B, an encapsulant 20M may be disposed or formed to encapsulate the regulator element 210, the inductor 220, and the capacitor 270 and cover the top surfaces thereof to form a power module 20. In some arrangements, the encapsulation 20M covers the conductive pads 2101, 2201, and 2701. In some arrangements, the conductive pads 2102, 2202, and 2702 contact the release film 720.

Figure 7C:
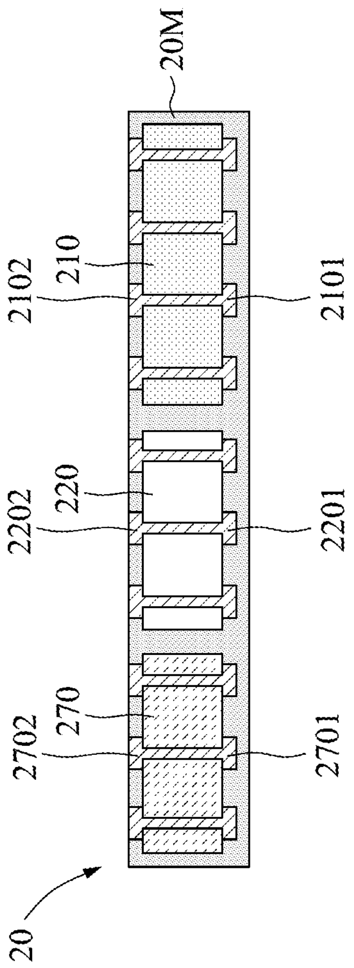

Referring to FIG. 7C, the release film 720 and the carrier 710 may be removed from the power module 20, and the structure is flipped over to allow the conductive pads 2102, 2202, and 2702 facing upwards and exposed by the encapsulation 20M.

Figure 7D:
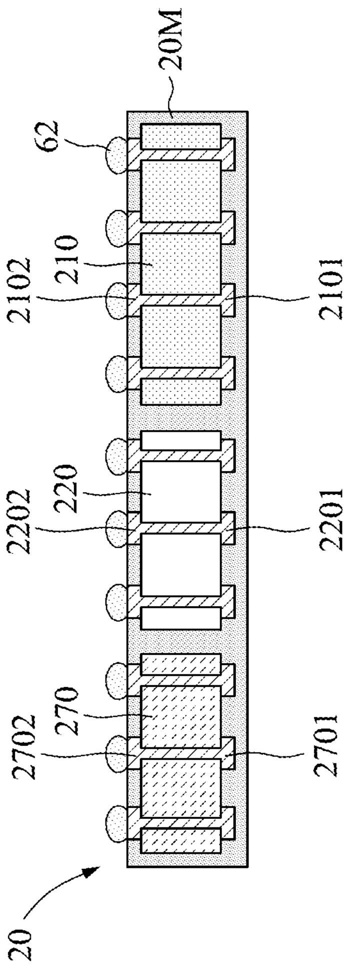

Referring to FIG. 7D, connection elements 62 may be disposed on the exposed conductive pads 2102, 2202, and 2702.

Figure 7E:
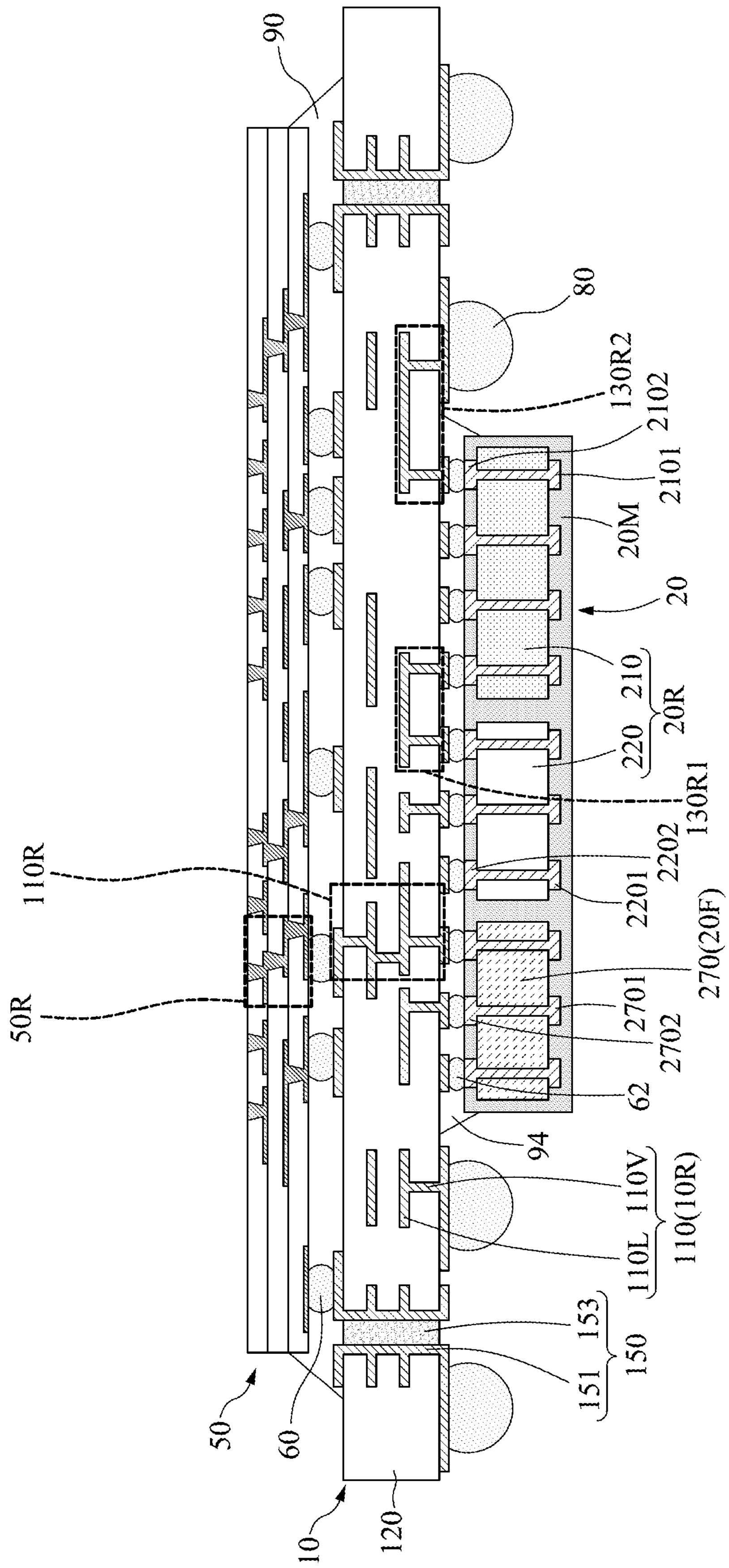

Referring to FIG. 7E, a substrate 10 including a dielectric layer 120 and a circuit structure 10R may be provided. In some arrangements, the circuit structure 10R includes an upper structure 110 (also referred to as "a sub-structure"), conductive layers 160, and conductive vias 150. In some arrangements, the dielectric layer 120 may include plurality of sub-layers (not shown in drawings) laminated to each other. The conductive vias 150 penetrate the dielectric layer 120 and electrically connect the circuit layers 110L on opposite sides of the dielectric layer 120. Next, connection elements 62 and electrical contacts 80 may be disposed on the circuit layer 110L, the power module 20 disposed on and electrically connected to the connection elements 62, and an encapsulant 94 may be formed or disposed to encapsulate the connection elements 62. Connection elements 60 may be disposed on the circuit layer 110L, an RDL 50 may be disposed on and electrically connected to the connection elements 60, and an underfill 90 may be formed or disposed to encapsulate the connection elements 60.

Figure 7F:
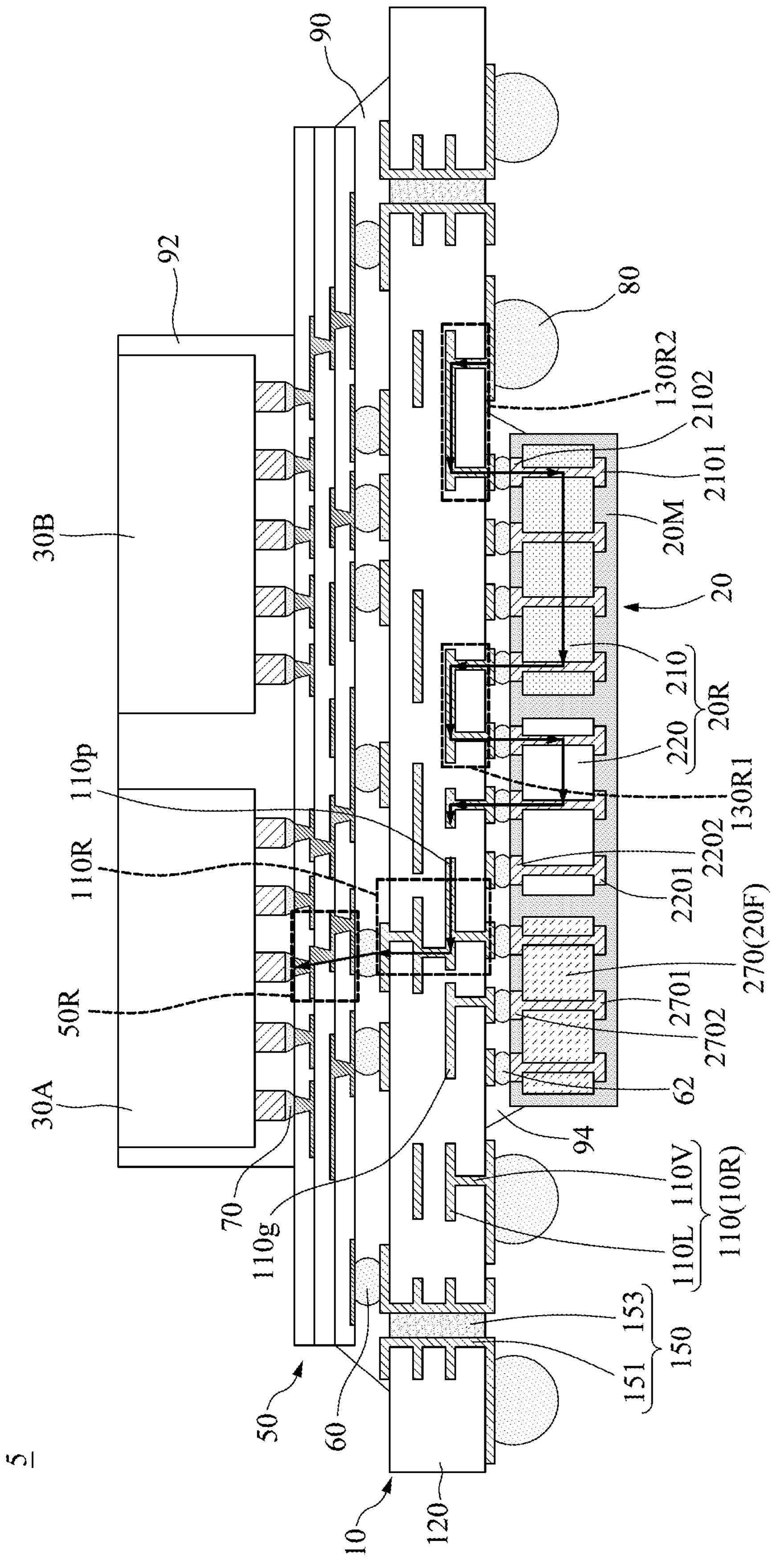

Referring to FIG. 7F, connection elements 70 may be disposed on the RDL 50, electronic components 30A and 30B may be disposed on and electrically connected to the connection elements 70, and an encapsulant 92 may be formed or disposed to encapsulate the electronic components 30A and 30B and the connection elements 70. As such, the package structure 5 is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:

a substrate defining a cavity; and a power module comprising a power regulation portion and a noise filter portion, wherein the power regulation portion and the noise filter portion are disposed in the cavity of the substrate. wherein the power regulation portion is configured to operate at a first frequency, and the noise filter portion is configured to operate at a second frequency higher than the first frequency.

2. The package structure as claimed in claim 1, wherein the power regulation portion comprises a power management integrated circuit (PMIC).

3. The package structure as claimed in claim 1, further comprising an electronic component over the substrate, wherein the noise filter portion is closer to the electronic component than the power regulation portion is.

4. The package structure as claimed in claim 3, wherein the power regulation portion is configured to regulate a power signal into a regulated power signal, and the noise filter portion is configured to decouple noise from the regulated power signal and then transmit the regulated power signal to the electronic component.

5. The package structure as claimed in claim 3, further comprising a power path passing the power regulation portion and connected to the noise filter portion in parallel, wherein the noise filter portion is configured to decouple noise from a regulated power signal transmitted from the power regulation portion.

6. The package structure as claimed in claim 5, wherein the power path comprises a first path portion extending from the power regulation portion to the noise filter portion and a second path portion extending from the noise filter portion to the electronic component, and a path length of the first path portion is greater than a path length of the second path portion.

7. The package structure as claimed in claim 5, wherein the power regulation portion is between at least two segments of the noise filter portion from a top view perspective.

8. The package structure as claimed in claim 5, wherein the power path comprises a vertical path portion extending from the noise filter portion (20F) to the electronic component.

9. The package structure as claimed in claim 8, wherein the power path further comprises a horizontal path portion extending from the power regulation portion to the noise filter portion.

10. A package structure, comprising:

a substrate;

an electronic component over the substrate; and a power module comprising a power regulation portion and a noise filter portion embedded in the substrate, wherein the package structure defines a power path configured to provide a power signal to the electronic component, the power path comprises a first path portion extending from the power regulation portion to the noise filter portion and a second path portion extending from the noise filter portion to the electronic component, and a path length of the first path portion is greater than a path length of the second path portion.

11. The package structure as claimed in claim 10, further comprising a high-density wiring structure between the electronic component and the substrate, wherein the second path portion of the power path comprises a vertical segment passing a portion of the high-density wiring structure.

12. The package structure as claimed in claim 10, wherein the power regulation portion is between at least two segments of the noise filter portion from a top view perspective.

13. The package structure as claimed in claim 12, wherein the power regulation portion comprises a first capacitor, the noise filter portion comprises a plurality of second capacitors, and the first capacitor has a first lateral side horizontally overlapping at least two of the second capacitors from the top view perspective.

14. The package structure as claimed in claim 13, wherein the noise filter portion further comprises a plurality of third capacitors different from the second capacitors, and the first capacitor further has a second lateral side non-parallel to the first lateral side and horizontally overlapping at least two of the third capacitors from the top view perspective.

15. The package structure as claimed in claim 14, wherein the noise filter portion further comprises a plurality of fourth capacitors different from the second capacitors and the third capacitors, the second capacitors are closer to the first capacitor than the fourth capacitors are, and the second capacitors are configured to operate at a frequency lower than that of the fourth capacitors.

16. A package structure, comprising:

a substrate; and a power regulation module embedded in the substrate; and a noise filter module embedded in the substrate and comprising a first capacitor and a second capacitor, wherein the second capacitor is configured to operate at a frequency higher than that of the first capacitor, and the second capacitor is closer to an edge of the substrate than the first capacitor is.

17. The package structure as claimed in claim 16, further comprising an electronic component over the substrate, wherein the power regulation module comprises a third capacitor configured to operate at a frequency lower than that of the first capacitor, and the third capacitor is disposed closer to a central region of the electronic component than the first capacitor and the second capacitor are.

18. The package structure as claimed in claim 16, further comprising a first electronic component and a second electronic component over the substrate, wherein a portion of the noise filter module is below a gap between the first electronic component and the second electronic component and configured to provide a first decoupled power signal to the first electronic component and a second decoupled power signal to the second electronic component.

19. The package structure as claimed in claim 18, wherein the package structure defines a first power path for transmitting the first decoupled power signal and a second power path for transmitting the second decoupled power signal, wherein the first power path extends between the portion of the noise filter module and the first electronic component, and the second power path extends between the portion of the noise filter module and the second electronic component.

* * * * *